US012772645B2

(12) United States Patent
Xie

(10) Patent No.: US 12,772,645 B2
(45) Date of Patent: Oct. 20, 2026

(54) ARRAY SUBSTRATE, DISPLAY PANEL AND DISPLAY DEVICE

(71) Applicant: Tianma Advanced Display Technology Institute (Xiamen) Co., Ltd., Xiamen (CN)

(72) Inventor: Mengmeng Xie, Xiamen (CN)

(73) Assignee: Tianma Advanced Display Technology Institute (Xiamen) Co., Ltd., Xiamen (CN)

(*) Notice: Subject to any disclaimer, the term of this patent is extended or adjusted under 35 U.S.C. 154(b) by 477 days.

(21) Appl. No.: 18/387,489

(22) Filed: Nov. 7, 2023

(65) Prior Publication Data

US 2024/0072102 A1 Feb. 29, 2024

(30) Foreign Application Priority Data

Jun. 27, 2023 (CN) ......................... 202310769432.8

(51) Int. Cl.

| | |
|---|---|
| ***H10H 29/14*** | (2025.01) |
| ***H10D 86/40*** | (2025.01) |
| ***H10D 86/60*** | (2025.01) |
| ***H10H 20/857*** | (2025.01) |
| ***H10W 90/00*** | (2026.01) |

(52) U.S. Cl.

CPC ........ *H10H 29/142* (2025.01); *H10D 86/441* (2025.01); *H10D 86/481* (2025.01); *H10D 86/60* (2025.01); *H10H 20/857* (2025.01); *H10W 90/00* (2026.01)

(58) Field of Classification Search

CPC ... H10H 29/142; H10D 86/441; H10D 86/481

See application file for complete search history.

(56) References Cited

U.S. PATENT DOCUMENTS

2022/0157854 A1* 5/2022 Ito .......................... H10D 86/60
2023/0102430 A1* 3/2023 Kurosaka ........... G02B 27/0012 372/43.01
2024/0098894 A1* 3/2024 Kim ....................... H05K 1/111
2024/0260376 A1* 8/2024 Kodama ............ H10K 59/8792

FOREIGN PATENT DOCUMENTS

CN 109830191 A 5/2019

* cited by examiner

*Primary Examiner* — Mounir S Amer
(74) *Attorney, Agent, or Firm* — KDW FIRM PLLC

(57) ABSTRACT

Provided are an array substrate, a display panel and a display device, relating to the field of display technology. The array substrate includes a pixel disposition region including multiple pixel regions arranged along a first direction and a second direction. The first direction intersects the second direction. The pixel disposition region includes a first region and a second region that each includes at least one pixel region. The array substrate further includes a substrate and marks located on one side of the substrate and in the pixel disposition region. In the first region, marks of the at least one pixel region are a first arrangement pattern, and in the second region, marks of the at least one pixel region are a second arrangement pattern. The first arrangement pattern is different from the second arrangement pattern.

20 Claims, 31 Drawing Sheets

ARRAY SUBSTRATE, DISPLAY PANEL AND DISPLAY DEVICE

CROSS-REFERENCE TO RELATED APPLICATION(S)

This application claims priority to Chinese Patent Application No. 202310769432.8 filed Jun. 27, 2023, the disclosure of which is incorporated herein by reference in its entirety.

TECHNICAL FIELD

The present invention relates to the field of display technology and, in particular, to an array substrate, a display panel and a display device.

BACKGROUND

As a new generation of display technology, a micro light-emitting diode (micro-LED) display panel has the remarkable advantages of higher brightness, better light emission efficiency and lower power consumption. Different from an organic light-emitting diode (OLED) display panel using the preparation method of film deposition, light-emitting diodes arranged in a matrix in the micro light-emitting diode display panel are mainly implemented in the form of soft stamp transfer technology.

At present, when the soft stamp transfer technology is used for transferring the light-emitting diodes, the array substrate bearing the light-emitting diodes needs to be provided with an alignment mark. The size of the alignment mark is generally greater than 40 microns.

SUMMARY

The present invention provides an array substrate, a display panel and a display device to use a first arrangement pattern or a second arrangement pattern as an alignment mark, so there is no need to dispose a special alignment mark on the array substrate, saving space in a pixel disposition region.

In a first aspect, embodiments of the present invention provide an array substrate. The array substrate includes a pixel disposition region including a plurality of pixel regions arranged along a first direction and a second direction, where the first direction intersects the second direction. The pixel disposition region includes a first region and a second region that each includes at least one pixel region of the plurality of pixel regions. The array substrate further includes a substrate and marks located on one side of the substrate and in the pixel disposition region. In the first region, marks of the at least one pixel region are a first arrangement pattern, and in the second region, marks of the at least one pixel region are a second arrangement pattern, and the first arrangement pattern is different from the second arrangement pattern.

In a second aspect, embodiments of the present invention provide a display panel including an array substrate and a plurality of light-emitting diodes disposed in the plurality of pixel regions on the array substrate. The array substrate includes a pixel disposition region including a plurality of pixel regions arranged along a first direction and a second direction, where the first direction intersects the second direction. The pixel disposition region includes a first region and a second region that each includes at least one pixel region of the plurality of pixel regions. The array substrate further includes a substrate and marks located on one side of the substrate and in the pixel disposition region. In the first region, marks of the at least one pixel region are a first arrangement pattern, and in the second region, marks of the at least one pixel region are a second arrangement pattern, and the first arrangement pattern is different from the second arrangement pattern.

In a third aspect, embodiments of the present invention provide a display device including a display panel. The display panel includes an array substrate and a plurality of light-emitting diodes disposed in the plurality of pixel regions on the array substrate. The array substrate includes a pixel disposition region including a plurality of pixel regions arranged along a first direction and a second direction, where the first direction intersects the second direction. The pixel disposition region includes a first region and a second region that each includes at least one pixel region of the plurality of pixel regions. The array substrate further includes a substrate and marks located on one side of the substrate and in the pixel disposition region. In the first region, marks of the at least one pixel region are a first arrangement pattern, and in the second region, marks of the at least one pixel region are a second arrangement pattern, and the first arrangement pattern is different from the second arrangement pattern.

DETAILED DESCRIPTION

Figure 1:
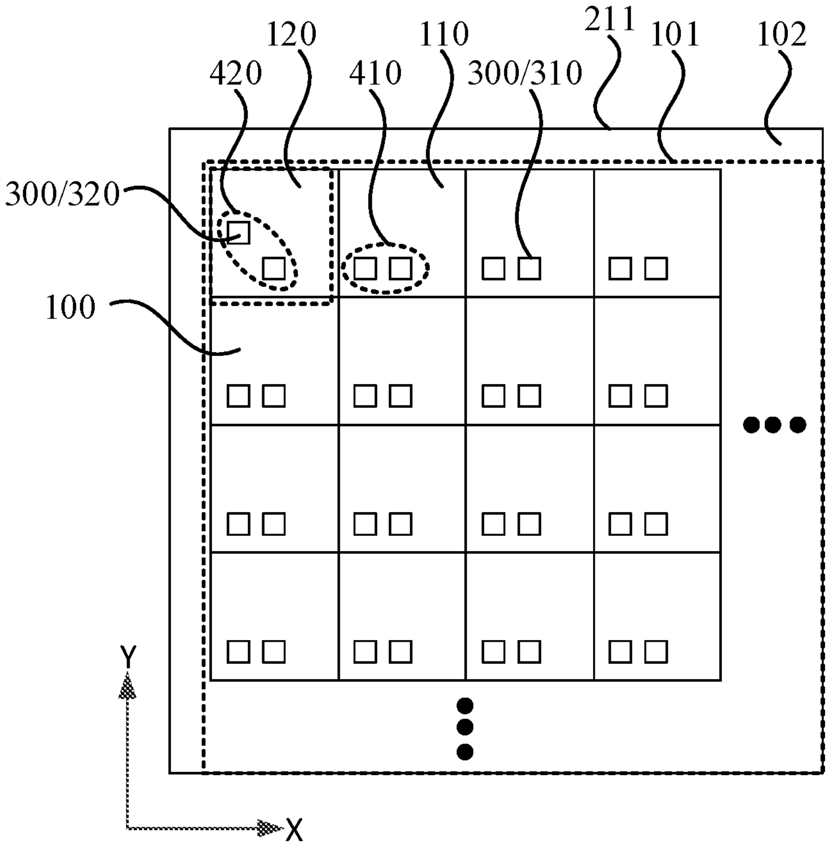
FIG. 1 is a top view of an array substrate according to an embodiment of the present invention.

Hereinafter the present invention is further described in detail in conjunction with the drawings and embodiments. It is to be understood that the embodiments described herein are intended to illustrate and not to limit the present invention. Additionally, it is to be noted that for ease of description, only part, not all, of structures related to the present invention are illustrated in the drawings.

FIG. 1 is a top view of an array substrate according to an embodiment of the present invention. Referring to FIG. 1, the array substrate includes a pixel disposition region 101. The pixel disposition region 101 includes multiple pixel regions 100 arranged along a first direction X and a second direction Y. A pixel region 100 is a basic light-emitting display region after a display panel is formed by mounting light-emitting diodes onto the array substrate. The first direction X intersects the second direction Y. In an embodiment, the first direction X is perpendicular to the second direction Y. In another embodiment, the first direction X and the second direction Y are not perpendicular and have an included angle greater than 0° and less than 90°. The pixel disposition region 101 includes a first region 110 and a second region 120. The first region 110 includes at least one pixel region 100, and the second region 120 includes at least one pixel region 100. The array substrate further includes a substrate 211 and marks 300. The marks 300 are located on one side of the substrate 211 and in the pixel disposition region 101.

In the first region 110, marks 300 in the at least one pixel region 100 are a first arrangement pattern 410. In the second region 120, marks 300 in the at least one pixel region 100 are a second arrangement pattern 420. The first arrangement pattern 410 is different from the second arrangement pattern 420.

In the array substrate according to this embodiment of the present invention, the marks 300 are disposed in the pixel disposition region 101 and do not occupy space outside of the pixel disposition region 101, reducing the bezel. The marks 300 in the first region 110 are arranged to form the first arrangement pattern 410, and the marks 300 in the second region 120 are arranged to form the second arrangement pattern 420. The first arrangement pattern 410 is different from the second arrangement pattern 420, and there is a difference between the first arrangement pattern 410 and the second arrangement pattern 420. Therefore, the first arrangement pattern 410 or the second arrangement pattern 420 can be used as an alignment mark, so there is no need to dispose a special alignment mark on the array substrate, saving space in the pixel disposition region 101.

In an embodiment, referring to FIG. 1, the array substrate includes a peripheral circuit region 102 located at the periphery of the pixel disposition region 101. The peripheral circuit region 102 does not include the plurality of pixel regions 100. A gate driving circuit, an electrostatic discharging circuit and others may be disposed in the peripheral circuit region 102.

In an embodiment, referring to FIG. 1, in the first region 110, two marks 300 of the at least one region 100 are arranged to form the first arrangement pattern 410. In the second region 120, two marks 300 of the at least one pixel region 100 are arranged to form the second arrangement pattern 420. The first arrangement pattern 410 or the second arrangement pattern 420 formed by multiple marks 300 is used as an alignment mark, that is, the first arrangement pattern 410 or the second arrangement pattern 420 formed by the multiple marks 300 is used as one recognition unit. An arrangement pattern formed by the multiple marks 300 is used as a whole for recognition by increasing the number of marks 300 so that recognition accuracy can be increased.

Figure 2:
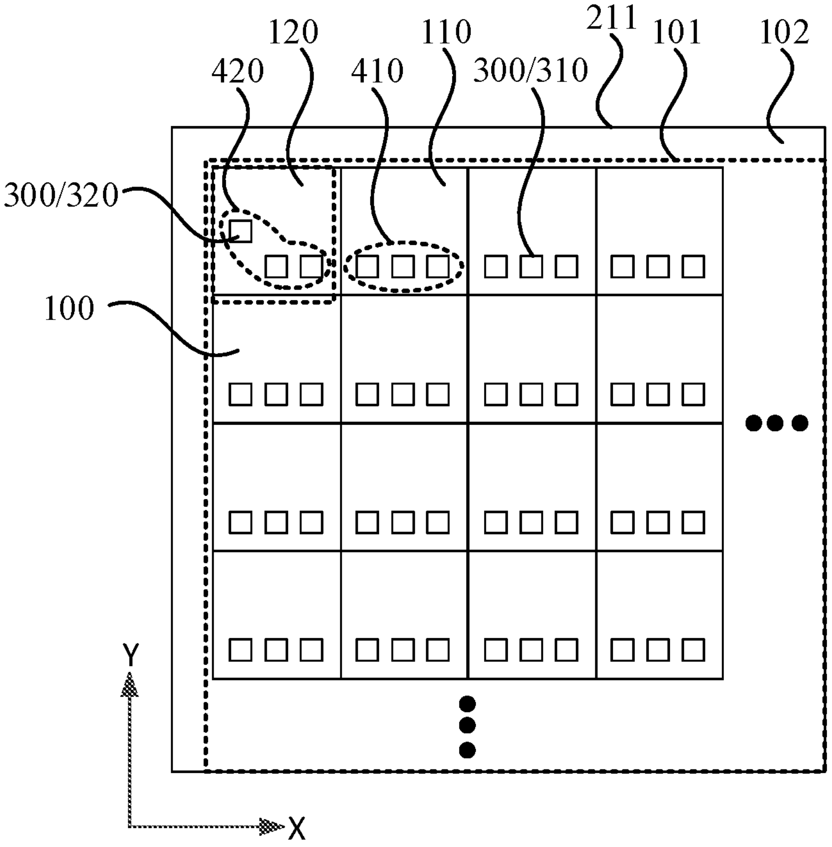
FIG. 2 is a top view of another array substrate according to an embodiment of the present invention.

FIG. 2 is a top view of another array substrate according to an embodiment of the present invention. Referring to FIG. 2, in the first region 110, three marks 300 of the at least one pixel region 100 are arranged to form the first arrangement pattern 410. In the second region 120, three marks 300 of the at least one pixel region 100 are arranged to form the second arrangement pattern 420. The number of marks 300 arranged to form the first arrangement pattern 410 and the number of marks 300 arranged to form the second arrangement pattern 420 are not limited in this embodiment of the present invention.

Figure 3:
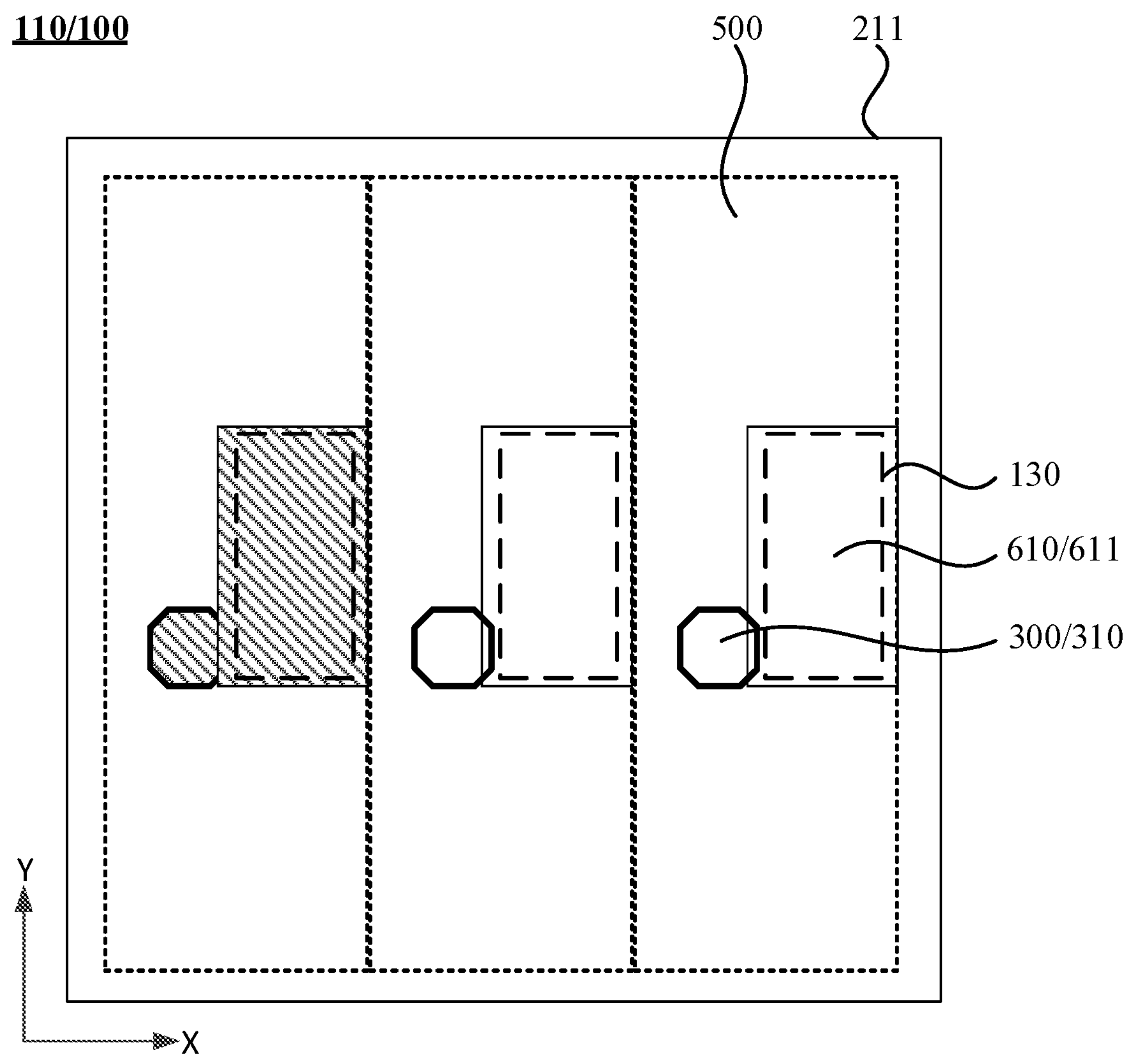
FIG. 3 is a top view of a first region according to an embodiment of the present invention.

FIG. 3 is a top view of a first region according to an embodiment of the present invention. Referring to FIGS. 2 and 3, the pixel region 100 includes multiple sub-pixel regions 500. The pixel region 100 including three sub-pixel regions 500 is used as an example for illustration in FIG. 3. However, this is not limited herein. In other embodiments, the pixel region 100 includes two or more sub-pixel regions 500. The array substrate further includes electrode pads 610 located on one side of the substrate 211, at least partially located in the multiple sub-pixel regions 500 and the electrode pad 610 is configured to be electrically connected to the electrode of a to-be-mounted light-emitting diode. The electrode pad 610 includes an overlapping region 130 being a light-emitting diode disposition region. When the light-emitting diode is transferred to the array substrate, the electrode of the light-emitting diode overlaps the overlapping region 130 of an electrode pad 610.

The orthographic projections of the marks 300 on the substrate 211 do not overlap the orthographic projection of the overlapping region 130 on the substrate 211. Marks 300 are located outside of the overlapping region 130 and are not blocked by the overlapping region 130 of the electrode pad 610 before the light-emitting diode is mounted onto the array substrate so that the marks 300 can be recognized. In this embodiment of the present invention, after the light-emitting diode is mounted onto the array substrate, the electrode of the light-emitting diode overlaps the overlapping region 130 of the electrode pad 610 and is not affected by the marks 300 outside of the overlapping region 130.

As an example, if the electrode pad 610 of a hollowed portion is used as an alignment mark in the overlapping region 130, the hollowed portion is not conductive, increasing a bonding resistance between the electrode pad 610 and the electrode of the light-emitting diode. The marks 300 are located outside of the overlapping region 130, and there is no need to hollow a portion of the electrode pad 610 in the overlapping region 130 so that the bonding resistance between the electrode pad 610 and the electrode of the light-emitting diode cannot be increased.

In an embodiment, referring to FIGS. 2 and 3, the electrode pad 610 includes a first electrode pad 611 located in the multiple sub-pixel regions 500. Multiple first electrode pads 611 are arranged along the first direction X and the second direction Y. The array substrate according to this embodiment of the present invention is applicable to being mounted with a perpendicular light-emitting diode. The anode of the perpendicular light-emitting diode overlaps an overlapping region 130 of the first electrode pad 611 and is located between the cathode of the perpendicular light-emitting diode and the first electrode pad 611.

Figure 4:
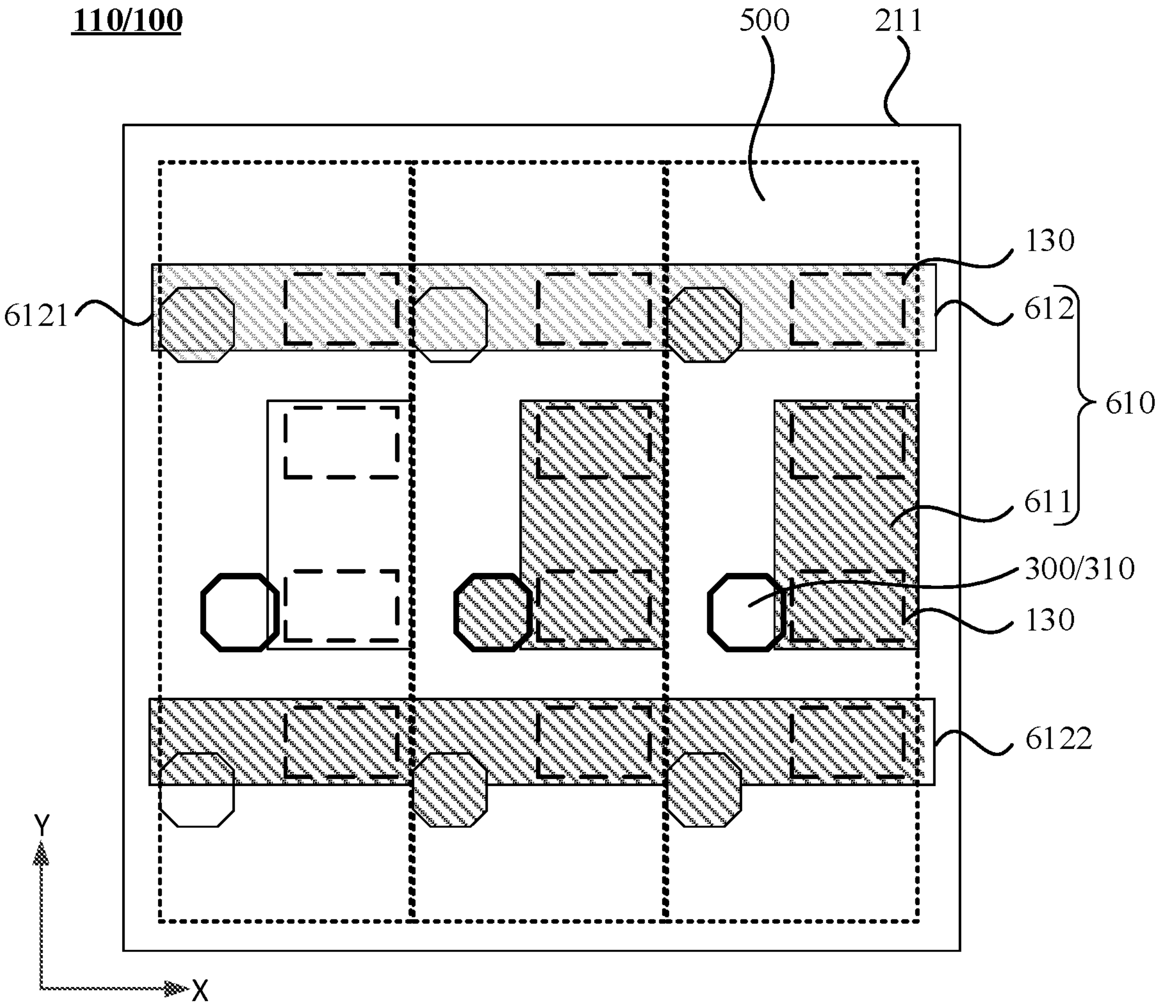
FIG. 4 is a top view of another first region according to an embodiment of the present invention.

FIG. 4 is a top view of another first region according to an embodiment of the present invention. Referring to FIG. 4, the electrode pad 610 includes the first electrode pad 611 and a second electrode pad 612. The first electrode pad 611 is located in the multiple sub-pixel regions 500. The multiple first electrode pads 611 are arranged along the first direction X and the second direction Y. The second electrode pad 612 is at least partially located in the multiple sub-pixel regions 500. Multiple second electrode pads 612 extend along the first direction X and are arranged along the second direction Y. The array substrate according to this embodiment of the present invention is applicable to being mounted with a horizontal light-emitting diode. The anode of the horizontal light-emitting diode overlaps the overlapping region 130 of the first electrode pad 611, and the cathode of the horizontal light-emitting diode overlaps an overlapping region 130 of the second electrode pad 612.

In an embodiment, referring to FIG. 4, in the same one sub-pixel region 500, two second electrode pads 612 are a first electrode sub-pad 6121 and a second electrode sub-pad 6122. The first electrode pad 611 is located between the first electrode sub-pad 6121 and the second electrode sub-pad 6122. The first electrode pad 611 includes two overlapping regions 130. Therefore, one sub-pixel region 500 may be mounted with two light-emitting diodes. In other embodiments, the same one sub-pixel region 500 may be provided with one first electrode pad 611 and one second electrode pad 612 and may be mounted with one light-emitting diode.

It is to be understood that the marks 300 may be located in the multiple sub-pixel regions 500. Original structures in the multiple sub-pixel regions 500 in the array substrate may serve as the marks 300 so that there is no need to add new structures specifically as the marks 300, further saving the space in the pixel disposition region 101. For clarity, the structures in the array substrate are briefly introduced.

Figure 5:
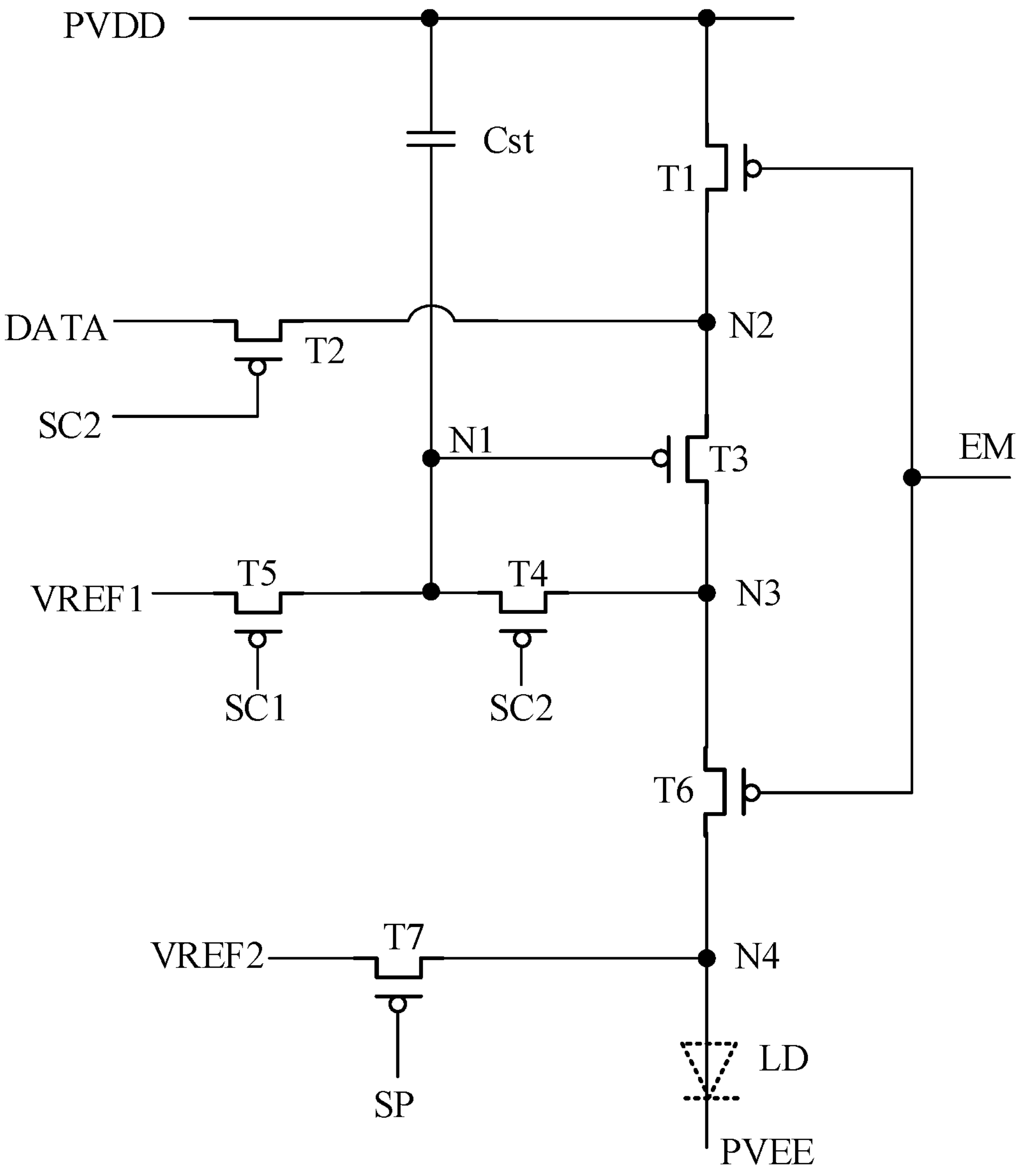
FIG. 5 is a diagram illustrating the circuit structure of a pixel driving circuit according to an embodiment of the present invention.

FIG. 5 is a diagram illustrating the circuit structure of a pixel driving circuit according to an embodiment of the present invention. Referring to FIG. 5, the pixel driving circuit includes multiple thin-film transistors. The multiple thin-film transistors include a power write transistor T1, a data write transistor T2, a drive transistor T3, a compensation transistor T4, a first reset transistor T5, a light emission control transistor T6 and a second reset transistor T7. The pixel driving circuit further includes a storage capacitance Cst. The first electrode of the power write transistor T1 is electrically connected to a second power line PVDD, the second electrode of the power write transistor T1 is electrically connected to a second node N2, and the gate of the power write transistor T1 is electrically connected to a light emission control scan signal line EM. The second power line PVDD is configured to supply a positive power voltage. The first electrode of the data write transistor T2 is electrically connected to a data line DATA, the second electrode of the data write transistor T2 is electrically connected to the second node N2, and the gate of the data write transistor T2 is electrically connected to a second scan signal line SC2. The first electrode of the drive transistor T3 is electrically connected to the second node N2, the second electrode of the drive transistor T3 is electrically connected to a third node N3, and the gate of the drive transistor T3 is electrically connected to a first node N1. The first electrode of the compensation transistor T4 is electrically connected to the first node N1, the second electrode of the compensation transistor T4 is electrically connected to the third node N3, and the gate of the compensation transistor T4 is electrically connected to the second scan signal line SC2. The first electrode of the first reset transistor T5 is electrically connected to the first node N1, the second electrode of the first reset transistor T5 is electrically connected to a first reset signal line VREF1, and the gate of the first reset transistor T5 is electrically connected to a first scan signal line SC1. The first electrode of the light emission control transistor T6 is electrically connected to the third node N3, the second electrode of the light emission control transistor T6 is electrically connected to a fourth node N4, and the gate of the light emission control transistor T6 is electrically connected to the light emission control scan signal line EM. The first electrode of the second reset transistor T7 is electrically connected to the fourth node N4, the second electrode of the second reset transistor T7 is electrically connected to a second reset signal line VREF2, and the gate of the second reset transistor T7 is electrically connected to an adjustment control signal line SP. The first plate C1 of the storage capacitance Cst is electrically connected to the first node N1, and the second plate C2 of the storage capacitance Cst is electrically connected to the second power line PVDD.

The first node N1, the second node N2, the third node N3 and the fourth node N4 may be virtually existing connection nodes or may be actually existing connection nodes. The first electrode pad 611 is connected to the fourth node N4.

Figure 6:
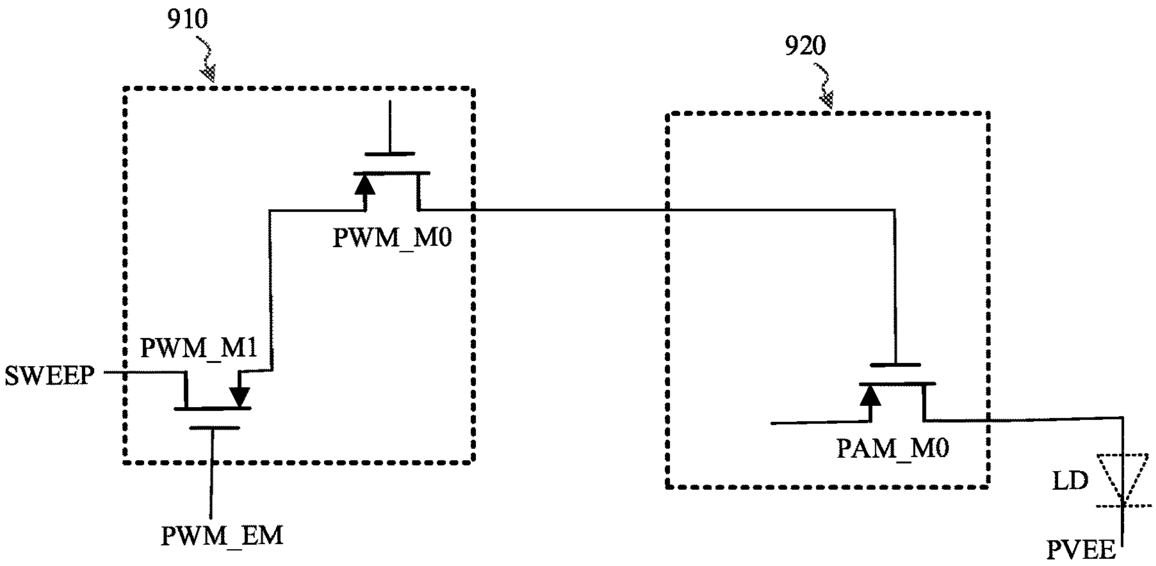
FIG. 6 is a diagram illustrating the circuit structure of a pixel driving circuit according to an embodiment of the present invention.

FIG. 6 is a diagram illustrating the circuit structure of a pixel driving circuit according to an embodiment of the present invention. Referring to FIG. 6, the pixel driving circuit includes a pulse width adjustment module 910 and an amplitude adjustment module 920. The pulse width adjustment module 910 includes a pulse width drive transistor PWM_M0 and a pulse width adjustment transistor PWM_M1. The first terminal of the pulse width adjustment transistor PWM_M1 is electrically connected to a sweep signal terminal SWEEP, the second terminal of the pulse width adjustment transistor PWM_M1 is electrically connected to the first terminal of the pulse width drive transistor PWM_M0, and the gate of the pulse width adjustment transistor PWM_M1 is electrically connected to a pulse width light emission signal terminal PWM EM.

The amplitude adjustment module 920 includes an amplitude drive transistor PAM_M0. The amplitude drive transistor PAM_M0 supplies a drive current to the light-emitting diode LD for driving the light-emitting diode LD to emit light. The pulse width drive transistor PWM_M0 is used for supplying a sweep signal supplied by the sweep signal terminal SWEEP to the gate of the amplitude drive transistor PAM_M0. The sweep signal turns off the amplitude drive transistor PAM_M0, and the amplitude drive transistor PAM_M0 does not supply the drive current to the light-emitting diode LD any longer, thereby turning off the amplitude adjustment module 920 and the light-emitting diode LD. Therefore, the light emission duration of the light-emitting diode LD can be controlled according to the sweep signal. The circuit structure of the pixel driving circuit is not limited in the present invention.

In the field of display technology, films are stacked to implement devices such as the multiple thin-film transistors and the storage capacitance Cst in the pixel driving circuit. Since metal films and semiconductor layers play key roles, one or more insulating layers may be used as spacings between the metal films and between the metal films and the semiconductor layers. The insulating layers are not described too much herein. The stacked structures of each metal film and semiconductor layer are briefly introduced below.

Figure 7:
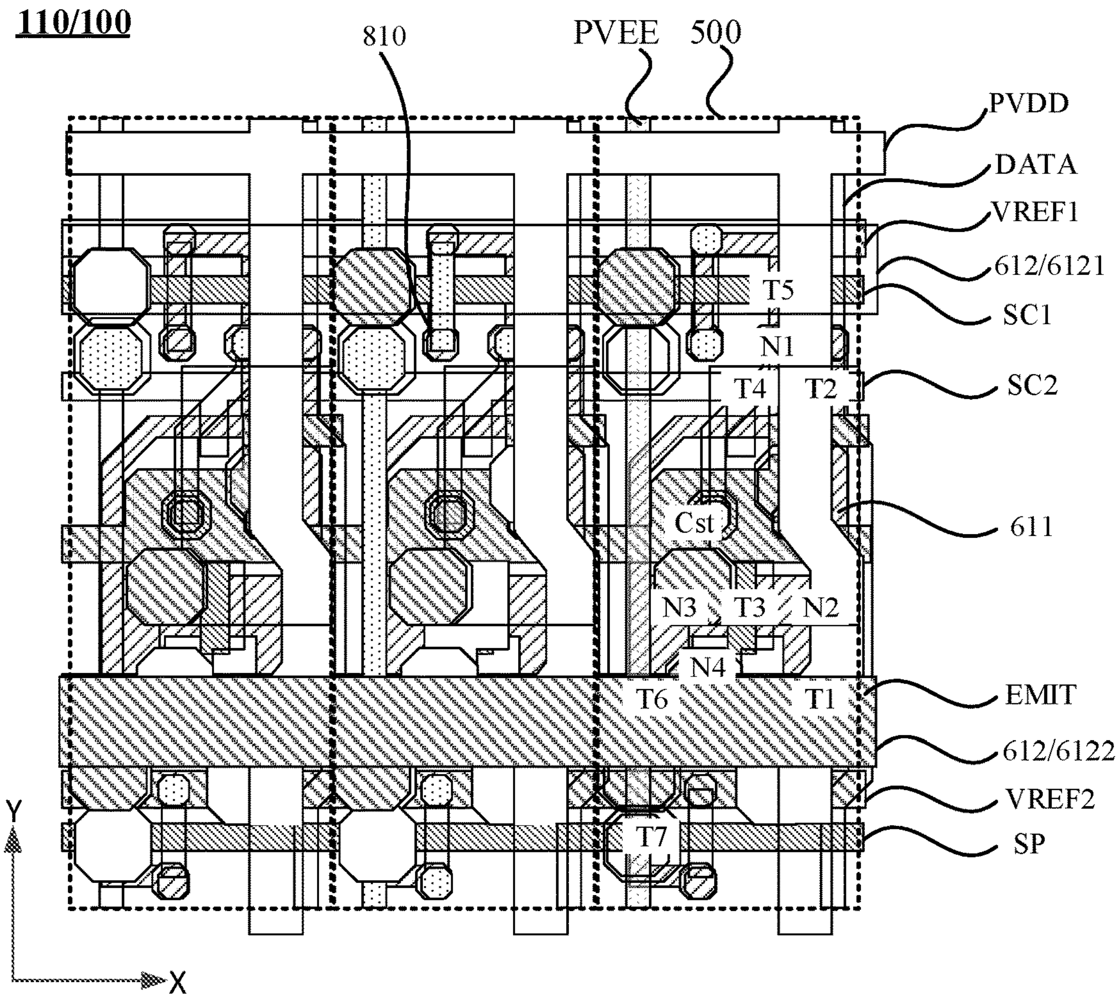
FIG. 7 is a top view of another first region according to an embodiment of the present invention.
Figure 8:
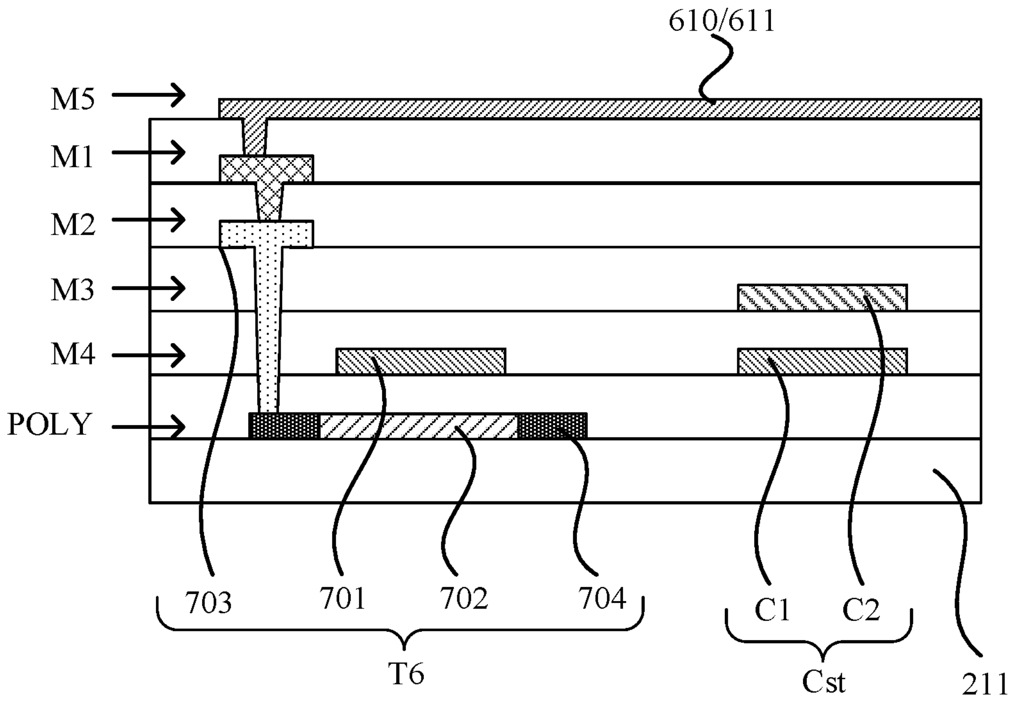
FIG. 8 is a diagram illustrating the sectional structure of an array substrate according to an embodiment of the present invention.

FIG. 7 is a top view of another first region according to an embodiment of the present invention. FIG. 7 illustrates a top view of three pixel driving circuits as shown in FIG. 5. FIG. 8 is a diagram illustrating the sectional structure of an array substrate according to an embodiment of the present invention. Referring to FIGS. 7 and 8, the array substrate includes a silicon semiconductor layer POLY, a fourth metal layer M4, a third metal layer M3, a second metal layer M2, a first metal layer M1 and a fifth metal layer M5 that are sequentially stacked. The silicon semiconductor layer POLY is located between the substrate 211 and the fourth metal layer M4.

Figure 9:
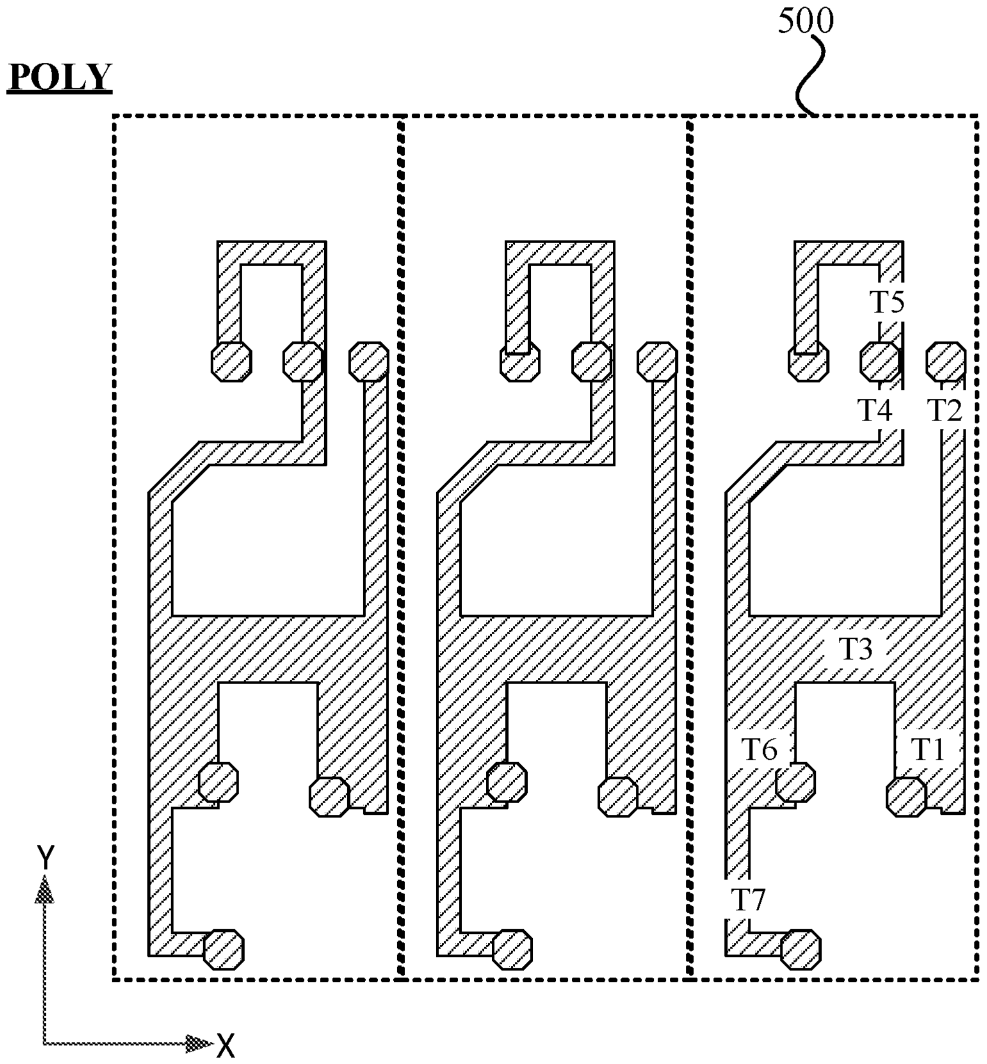
FIG. 9 is a top view of a silicon semiconductor layer according to an embodiment of the present invention.

FIG. 9 is a top view of a silicon semiconductor layer according to an embodiment of the present invention. Referring to FIGS. 7 to 9, the silicon semiconductor layer POLY includes silicon. The light emission control transistor T6 includes the gate 701 and a semiconductor layer. The semiconductor layer is a portion of the silicon semiconductor layer POLY that is not etched away. A lightly doped region in the semiconductor layer forms a channel layer 702. Two ends of the lightly doped region are highly doped regions. The conductivity of the highly doped regions is better than the conductivity of the lightly doped region. In the semiconductor layer, one highly doped region is connected to the metal of the second metal layer M2 through a connection via and serves as the source 703 of the light emission control transistor T6 while the other one highly doped region serves as the drain 704 of the light emission control transistor T6. The channel layer 702 is located in the silicon semiconductor layer POLY. In other embodiments, the silicon semiconductor layer POLY may include an oxide semiconductor material. It is to be noted that the structures of the multiple thin-film transistors in the pixel driving circuit are introduced herein using an example of the light emission control transistor T6, and that this is not limited herein.

Figure 10:
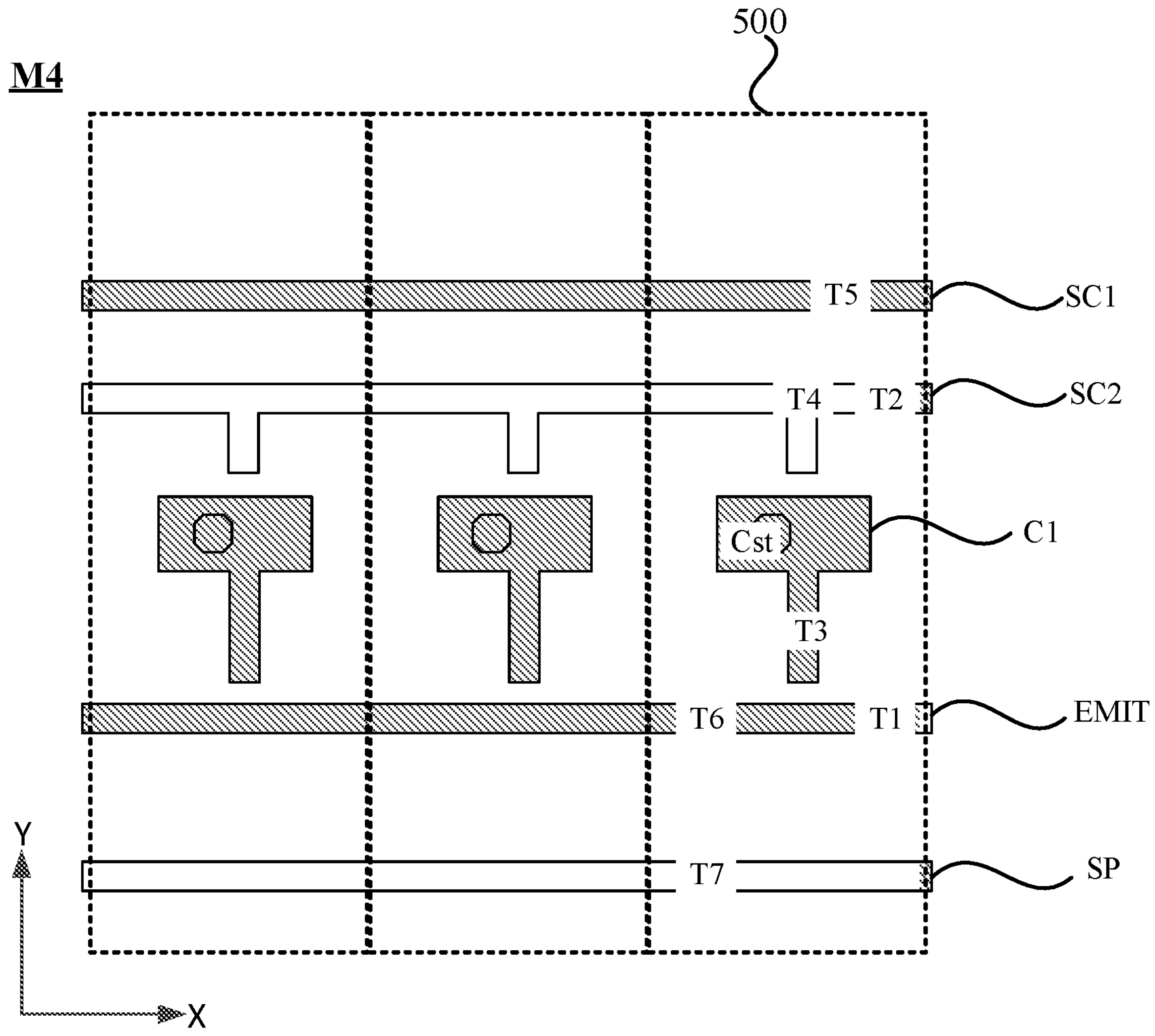
FIG. 10 is a top view of a fourth metal layer according to an embodiment of the present invention.

FIG. 10 is a top view of a fourth metal layer according to an embodiment of the present invention. Referring to FIGS. 7, 8 and 10, the gate 701 of the light emission control transistor T6 and the light emission control scan signal line EM are located in the fourth metal layer M4. The gate 701 of the light emission control transistor T6 may be a portion of the light emission control scan signal line EM that overlaps the semiconductor layer (specifically, the channel layer 702). The gate 701 of the light emission control transistor T6 is a portion of the light emission control scan signal line EM. The portion of the light emission control scan signal line EM that overlaps the semiconductor layer further forms the gate of the power write transistor T1.

The first scan signal line SC1 is located in the fourth metal layer M4, and a portion of the first scan signal line SC1 that overlaps the semiconductor layer forms the gate of the first reset transistor T5. The second scan signal line SC2 is located in the fourth metal layer M4, and a portion of the second scan signal line SC2 that overlaps the semiconductor layer forms the gate of the data write transistor T2 and the gate of the compensation transistor T4. The adjustment control signal line SP is located in the fourth metal layer M4, and a portion of the adjustment control signal line SP that overlaps the semiconductor layer forms the gate of the second reset transistor T7. The light emission control scan signal line EM, the first scan signal line SC1, the second scan signal line SC2 and the adjustment control signal line SP extend along the first direction X.

The storage capacitance Cst includes the first plate C1 and the second plate C2. The first plate C1 is located between the second plate C2 and the substrate 211 and in the fourth metal layer M4.

Figure 11:
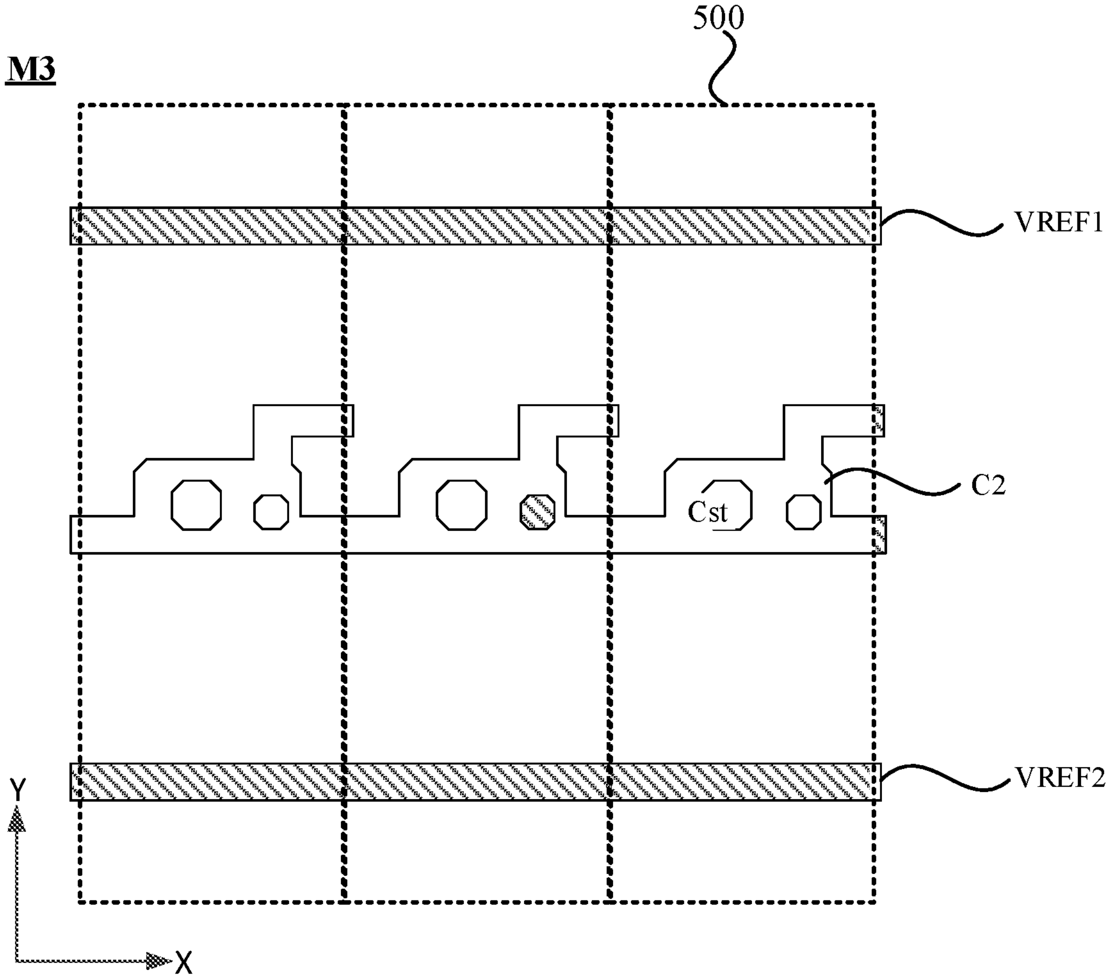
FIG. 11 is a top view of a third metal layer according to an embodiment of the present invention.

FIG. 11 is a top view of a third metal layer according to an embodiment of the present invention. Referring to FIGS. 7, 8 and 11, the second plate C2 of the storage capacitance Cst is located in the third metal layer M3. In a direction perpendicular to the plane on which the substrate 211 is located, the first plate C1 overlaps the second plate C2, thereby forming the storage capacitance Cst. The first reset signal line VREF1 and the second reset signal line VREF2 are located in the third metal layer M3 and extend along the first direction X.

Figure 12:
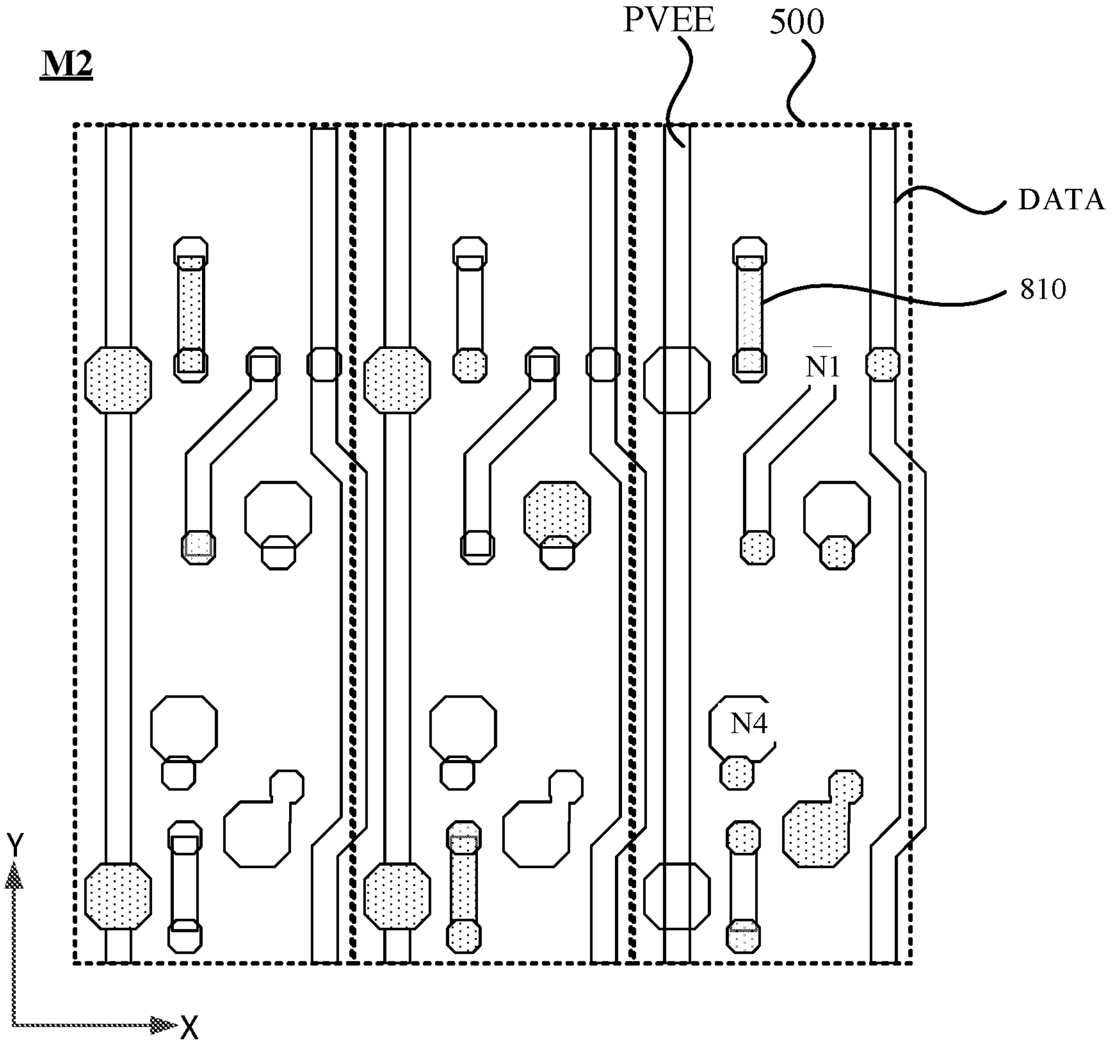
FIG. 12 is a top view of a second metal layer according to an embodiment of the present invention.

FIG. 12 is a top view of a second metal layer according to an embodiment of the present invention. Referring to FIGS. 7, 8 and 12, the source 703 is located in the second metal layer M2. The array substrate further includes a first power line PVEE configured to supply a negative power voltage. The first power line PVEE and the data line DATA are located in the second metal layer M2 and extend along the second direction Y. In an embodiment, the resistivity of the second metal layer M2 is less than the resistivity of the third metal layer M3 and the resistivity of the fourth metal layer M4, so the resistivity of the second metal layer M2 is relatively small so that the resistivities of the first power line PVEE and the data line DATA that are made of the metal in the second metal layer M2 can be relatively small, reducing the voltage drop of an electrical signal transmitted on the first power line PVEE and the voltage drop of an electrical signal transmitted on the data line DATA.

Figure 13:
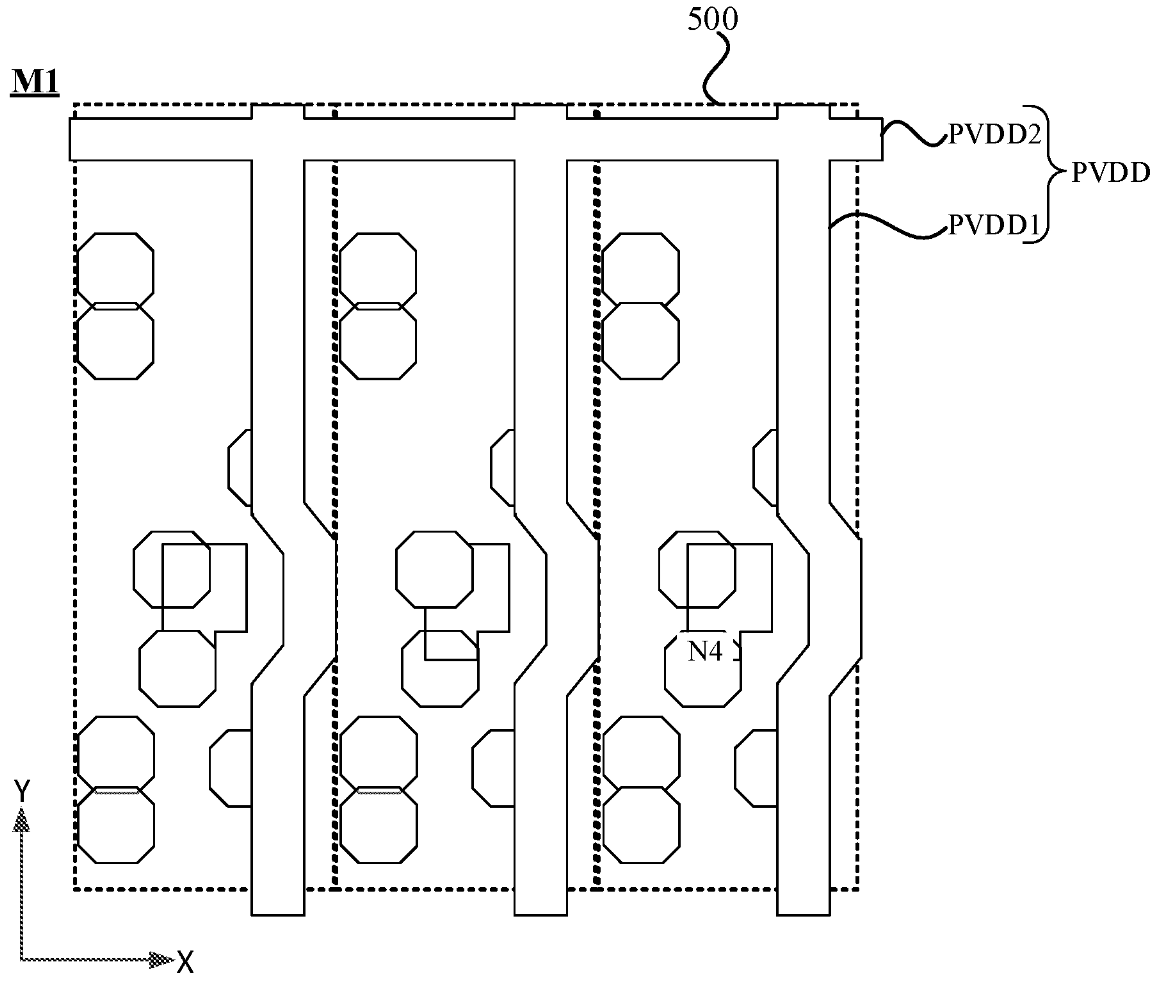
FIG. 13 is a top view of a first metal layer according to an embodiment of the present invention.

FIG. 13 is a top view of a first metal layer according to an embodiment of the present invention. Referring to FIGS. 7, 8 and 13, the second power line PVDD includes a first branch line PVDD1 and a second branch line PVDD2. The first branch line PVDD1 and the second branch line PVDD2 are located in the first metal layer M1. The first branch line PVDD1 and the second branch line PVDD2 intersect in the same layer to form a metal grid, reducing the voltage drop of the positive power voltage on the second power line PVDD. The first branch line PVDD1 extends along the second direction Y, and the second branch line PVDD2 extends along the first direction X.

Figure 14:
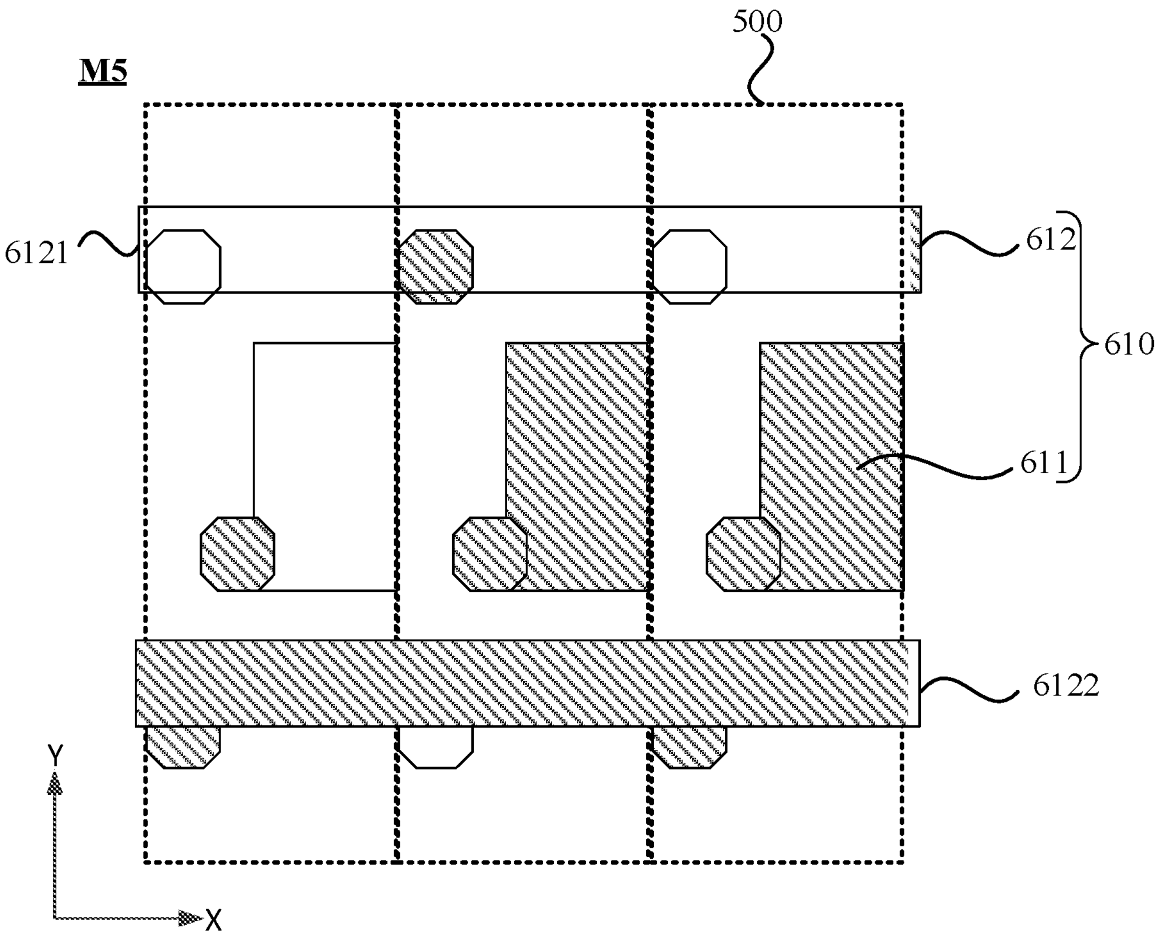
FIG. 14 is a top view of a fifth metal layer according to an embodiment of the present invention.

FIG. 14 is a top view of a fifth metal layer according to an embodiment of the present invention. Referring to FIGS. 7, 8 and 14, the electrode pads 610 are located in the fifth metal layer M5. The electrode pad 610 includes the first electrode pad 611 and the second electrode pad 612. The first electrode pad 611 is located in the fifth metal layer M5. The second electrode pad 612 is located in the fifth metal layer M5.

Figure 15:
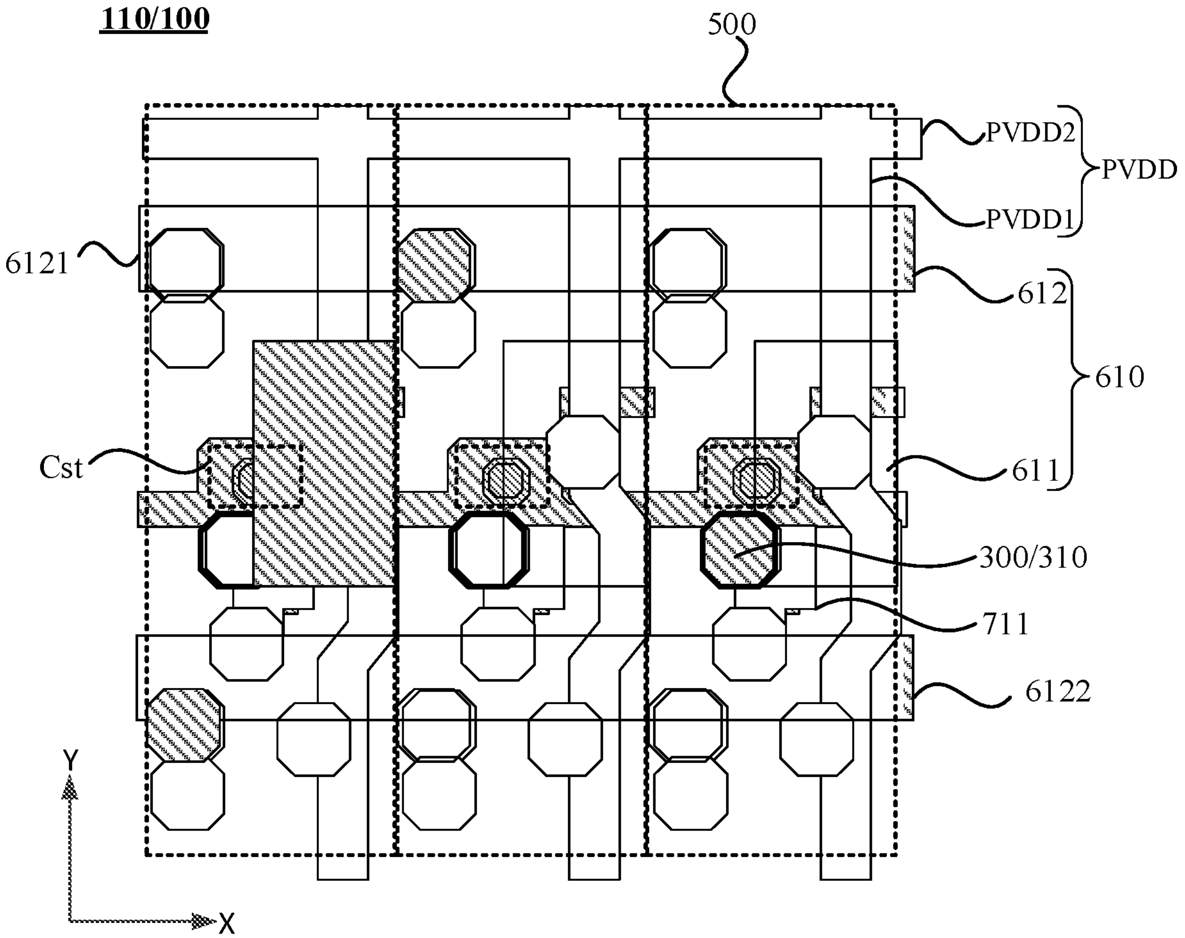
FIG. 15 is a top view of another first region according to an embodiment of the present invention.

FIG. 15 is a top view of another first region according to an embodiment of the present invention. Referring to FIGS. 8 and 15, the marks 300 and the electrode pads 610 are in the same layer. During recognition, a machine performs recognition by acquiring a pattern shape formed by metal reflection. In this embodiment of the present invention, the marks 300 and the electrode pads 610 are in the same layer and are located in the fifth metal layer M5. The fifth metal layer M5 is a film on one side facing away from the substrate 211, and the marks 300 are not blocked by an insulating layer between the fifth metal layer M5 and the substrate 211, thereby improving the intensity of reflected light formed by the marks 300, improving the contrast ratio in an image taken by the machine and increasing the recognition accuracy.

Figure 16:
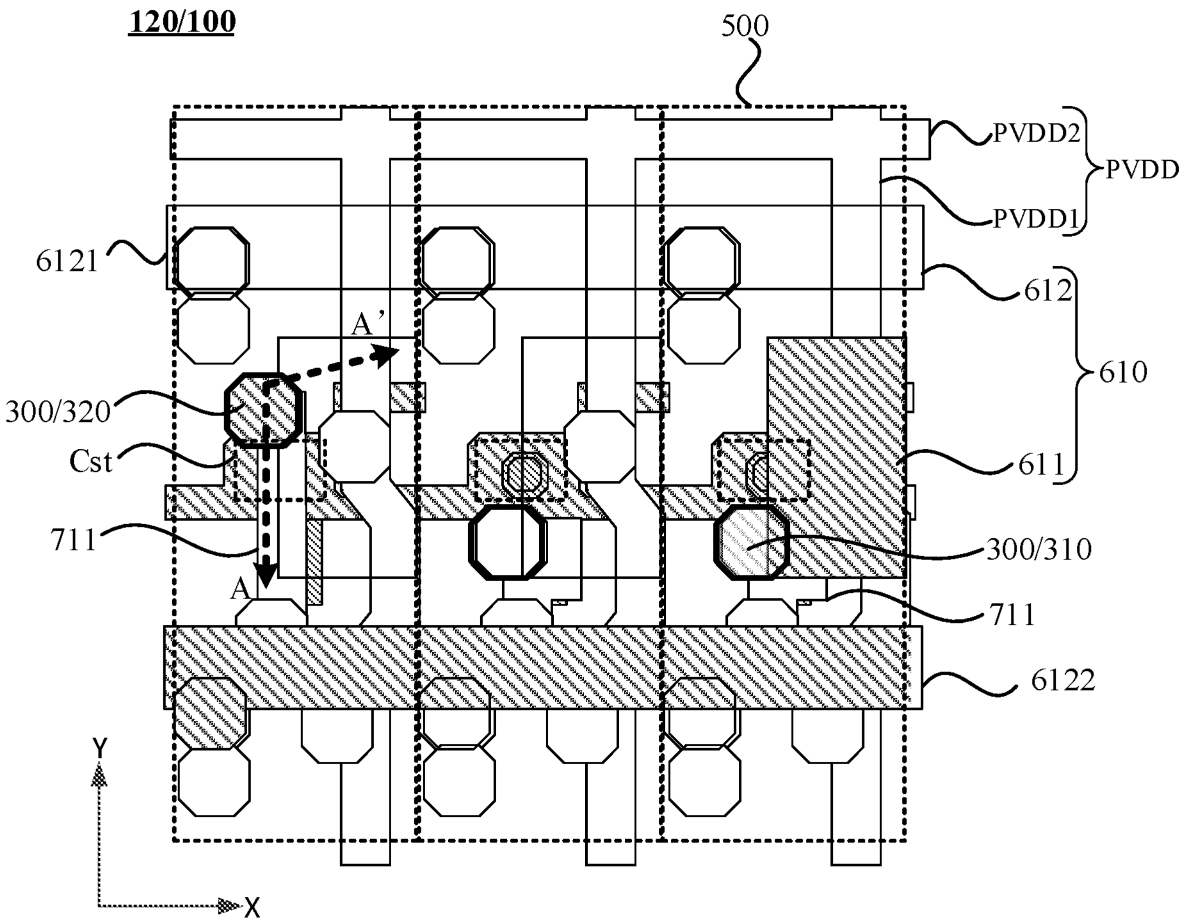
FIG. 16 is a top view of a second region according to an embodiment of the present invention.
Figure 17:
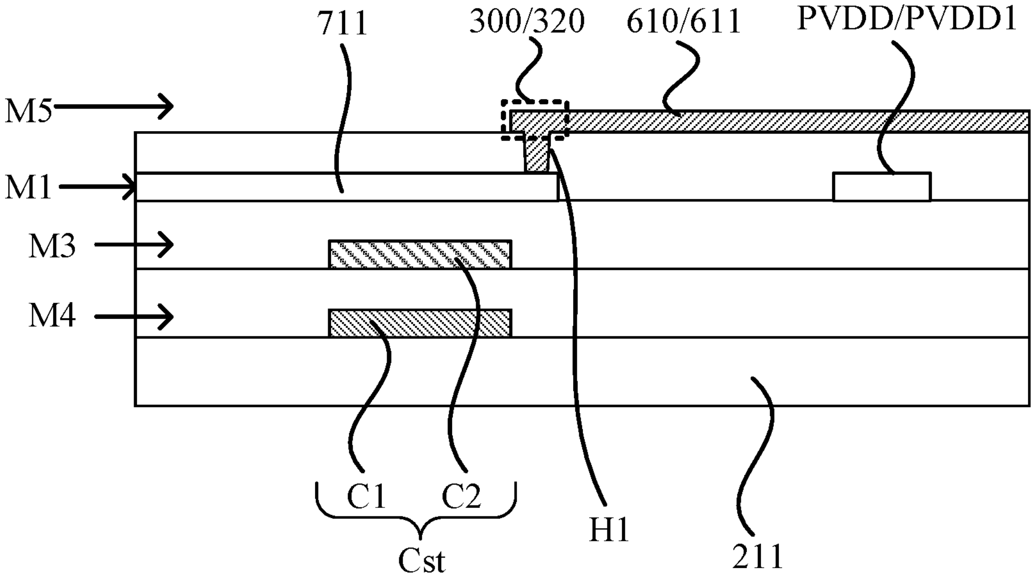
FIG. 17 is a sectional view taken along the AA' direction of FIG. 16.

FIG. 16 is a top view of a second region according to an embodiment of the present invention. FIG. 17 is a sectional view taken along the AA' direction of FIG. 16. Referring to FIGS. 16 and 17, the electrode pad 610 includes the first electrode pad 611. The multiple first electrode pads 611 are arranged along the first direction X and the second direction Y. The marks 300 are electrically connected to the first electrode pad 611. The array substrate further includes the first metal layer M1 including a first connection portion 711 located in the multiple sub-pixel regions 500. The first metal layer M1 is located between the substrate 211 and the marks 300. The marks 300 are electrically connected to the first connection portion 711 through a first connection via H1. In this embodiment of the present invention, the marks 300 and the first electrode pad 611 are electrically connected in the same layer, and the marks 300 are further electrically connected to the first connection portion 711 of the first metal layer M1 through the first connection via H1, thereby using the marks 300 to electrically connect the first electrode pad 611 and the first connection portion 711.

It is to be noted that the marks 300 and the electrode pads 610 are electrically connected in the same layer. During recognition, the machine acquires a pattern shape jointly formed by the marks 300 and the electrode pads 610. The pattern shapes of the marks 300 and the pattern shapes of the electrode pads 610 may be acquired by processing the pattern jointly formed by the marks 300 and the electrode pads 610. To visually display the marks 300, the pattern shapes of the marks 300 are depicted in bold line in the figures. It is to be understood that the pattern shape of a mark 300 may be described as octagon as shown in FIG. 16 or may also be described as a portion (hexagon) of the pattern jointly formed by the marks 300 and the electrode pad 610 in which the electrode pad 610 is removed. Two descriptions are equivalent for various embodiments of the present invention.

In an embodiment, referring to FIGS. 15 to 17, the array substrate further includes the storage capacitance Cst. The storage capacitance Cst is located in a sub-pixel region 500 and between the first electrode pad 611 and the substrate 211. The storage capacitance Cst includes the first plate C1 and the second plate C2. In the direction perpendicular to the plane on which the substrate 211 is located, the first plate C1 is located between the second plate C2 and the substrate 211, and the second plate C2 is located between the first plate C1 and the first electrode pad 611. The marks 300 in the first region 110 include a first mark 310. The marks 300 in the second region 120 include a second mark 320. As an example, the marks 300 in the first region 110 include three first marks 310. The marks 300 in the second region 120 include two first marks 310 and one second mark 320. Therefore, the three first marks 310 in the first region 110 form the first arrangement pattern 410, and the two first marks 310 and the second mark 320 in the second region 120 form the second arrangement pattern 420. The first arrangement pattern 410 is different from the second arrangement pattern 420. In other embodiments, the marks 300 in the second region 120 may further only include the second marks 320 not the first mark 310. For example, the three marks 300 in the second region 120 are all second marks 320.

In the first region 110 or the second region 120, along the second direction Y, in the same one sub-pixel region 500, the first mark 310 is located on the first side of the storage capacitance Cst. In the second region 120, along the second direction Y, in the same one sub-pixel region 500, the second mark 320 is located on the second side of the storage capacitance Cst. The first side and the second side are different sides of the storage capacitance Cst. In this embodiment of the present invention, the position of the first mark 310 in the same one sub-pixel region 500 is different from the position of the second mark 320 in the same one sub-pixel region 500. Different arrangement patterns are formed by differentiating the positions of the marks 300 in the same one sub-pixel region 500.

In an embodiment, referring to FIGS. 16 and 17, the first side of the storage capacitance Cst is opposite to the second side of the storage capacitance Cst. Along the second direction Y, in the same one sub-pixel region 500, the first mark 310 is located between the storage capacitance Cst and the second electrode sub-pad 6122, and the second mark 320 is located between the storage capacitance Cst and the first electrode sub-pad 6121. It is to be noted that in the direction perpendicular to the plane on which the substrate 211 is located, the first plate C1 overlaps the second plate C2. The orthographic projection of the first plate C1 on the substrate 211 occupies almost the same space as the orthographic projection of the second plate C2 on the substrate 211. Using the first plate C1, the second plate C2 or the storage capacitance Cst as a reference to describe the positional changes of the marks 300 in the same one sub-pixel region 500 is equivalent.

In an embodiment, referring to FIGS. 16 and 17, along the second direction Y, in the same one sub-pixel region 500, a first connection via H1 connecting the first mark 310 is located on the first side of the storage capacitance Cst. Along the second direction Y, in the same one sub-pixel region 500, a first connection via H1 connecting the second mark 320 is located on the second side of the storage capacitance Cst.

Figure 18:
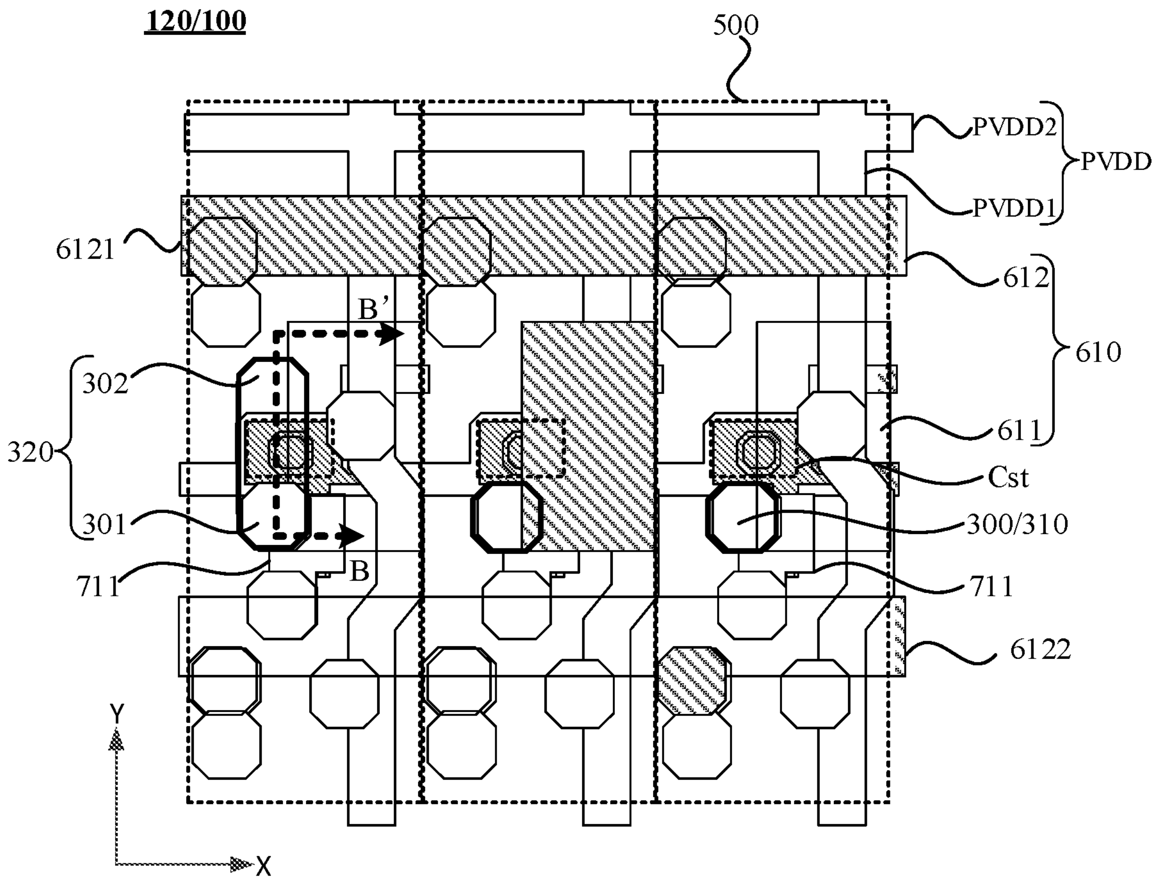
FIG. 18 is a top view of another second region according to an embodiment of the present invention.
Figure 19:
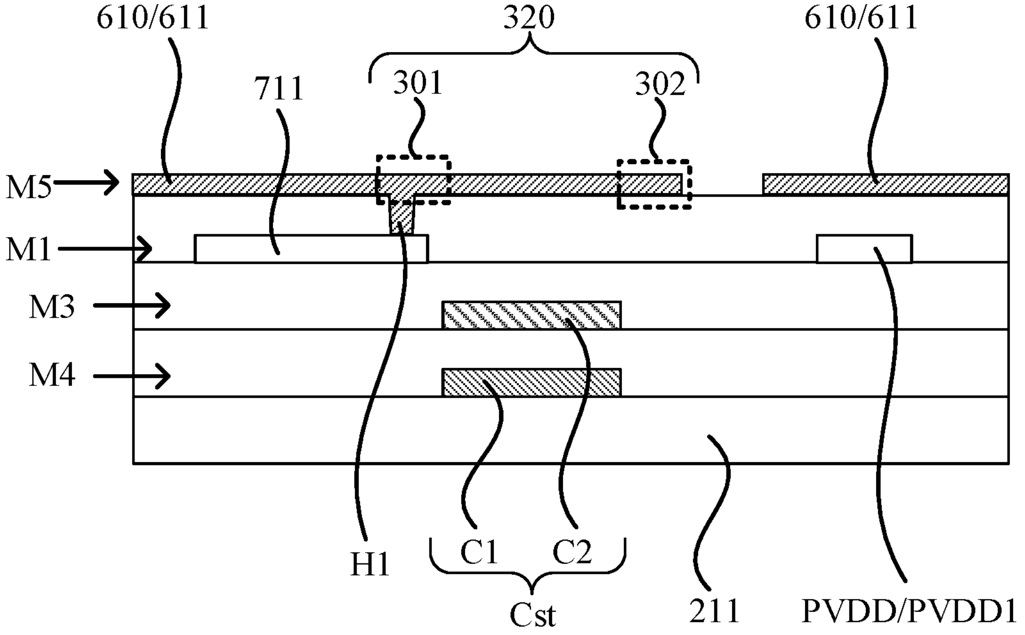
FIG. 19 is a sectional view taken along the BB' direction of FIG. 18.

FIG. 18 is a top view of another second region according to an embodiment of the present invention. FIG. 19 is a sectional view taken along the BB' direction of FIG. 18. Referring to FIGS. 15, 18 and 19, the second mark 320 includes a first portion 301 and the second portion 302 that are arranged along the second direction Y. The first portion 301 and the second portion 302 are two ends of the second mark 320. In the direction perpendicular to the plane on which the substrate 211 is located, the first portion 301 overlaps the first connection via H1. In the first region 110 or the second region 120, along the second direction Y, in the same one sub-pixel region 500, the first mark 310 is located on one side of the storage capacitance Cst. In the second region 120, along the second direction Y, in the same one sub-pixel region 500, the first portion 301 and the second portion 302 are located on two sides of the storage capacitance Cst respectively. In this embodiment of the present invention, the shape of the first mark 310 in the same one sub-pixel region 500 is different from the shape of the second mark 320 in the same one sub-pixel region 500. Different arrangement patterns are formed by differentiating the shapes of the marks 300 in the same one sub-pixel region 500.

In an embodiment, referring to FIGS. 18 and 19, along the second direction Y, in the same one sub-pixel region 500, the first connection via H1 connecting the first mark 310 is located on the first side of the storage capacitance Cst. Along the second direction Y, in the same one sub-pixel region 500, the first connection via H1 connecting the second mark 320 is located on the first side of the storage capacitance Cst. Multiple first connection vias H1 connecting multiple first marks 310 and the first connection via H1 connecting the second mark 320 are collinear. The position of the first connection via H1 connecting the first mark 310 in the same one sub-pixel region 500 is the same as the position of the first connection via H1 connecting the second mark 320 in the same one sub-pixel region 500, so there is no need to change the positions of the first connection vias H1 and the positions of lines and holes that are connected to the first connection vias H1, reducing the preparation difficulty of the array substrate.

In an embodiment, referring to FIGS. 18 and 19, along the second direction Y, in the same one sub-pixel region 500, the first portion 301 is located between the storage capacitance Cst and the second electrode sub-pad 6122, and the second portion 302 is located between the storage capacitance Cst and the first electrode sub-pad 6121.

The position of the first mark 310 of the first region 110 in the sub-pixel region 500 in which the first mark 310 is located is the same as the position of the first mark 310 of the second region 120 in the sub-pixel region 500 in which the first mark 310 is located. The shape and area of the first mark 310 in the first region 110 are the same as the shape and area of the first mark 310 in the second region 120. To visually display a change in the positions and/or areas of the first mark 310 and the second make 320 in the same one figure, in some embodiments of the present invention, the second region 120 including the first mark 310 and the second mark 320 is used as an example to illustrate the drawings, but this is not limited herein.

Figure 20:
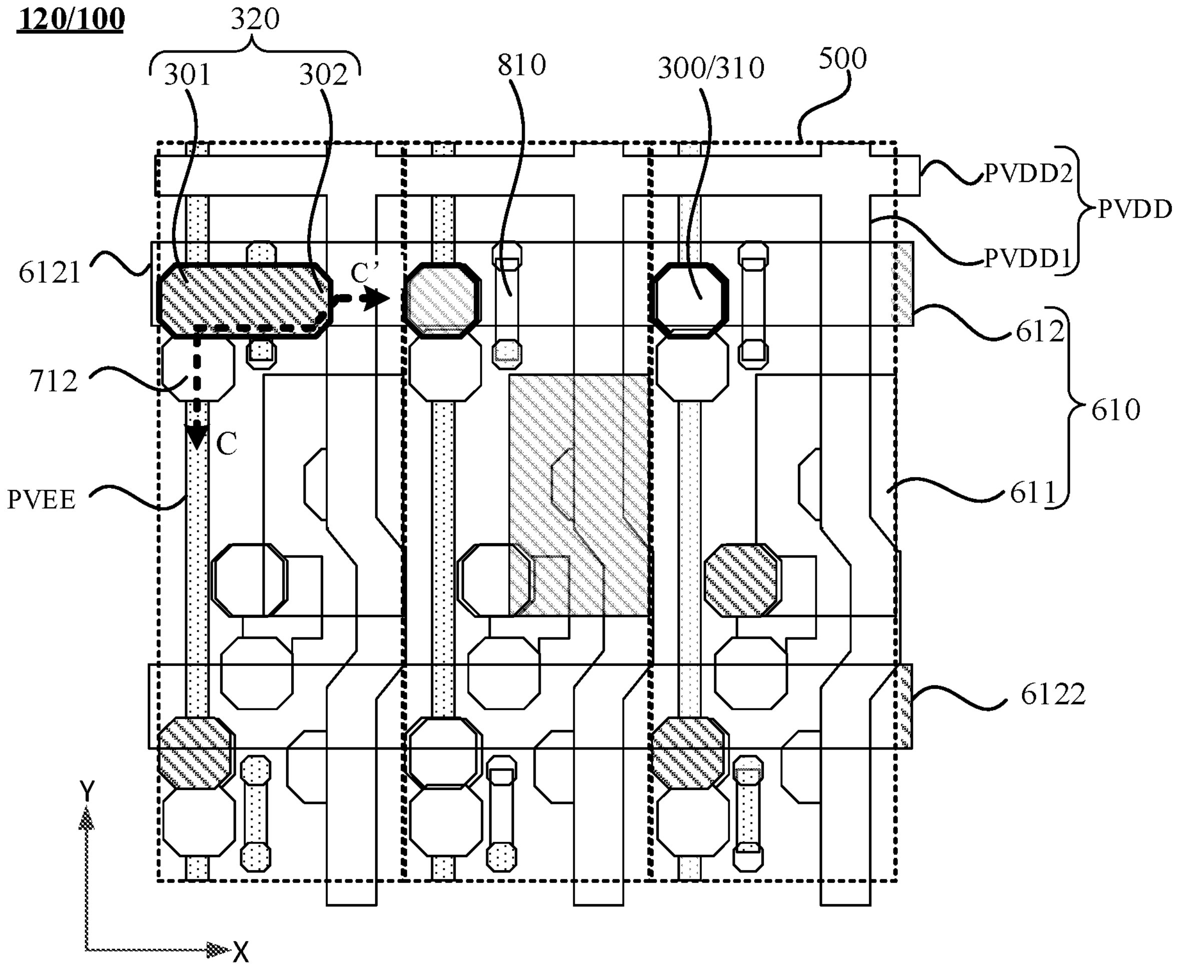
FIG. 20 is a top view of another second region according to an embodiment of the present invention.
Figure 21:
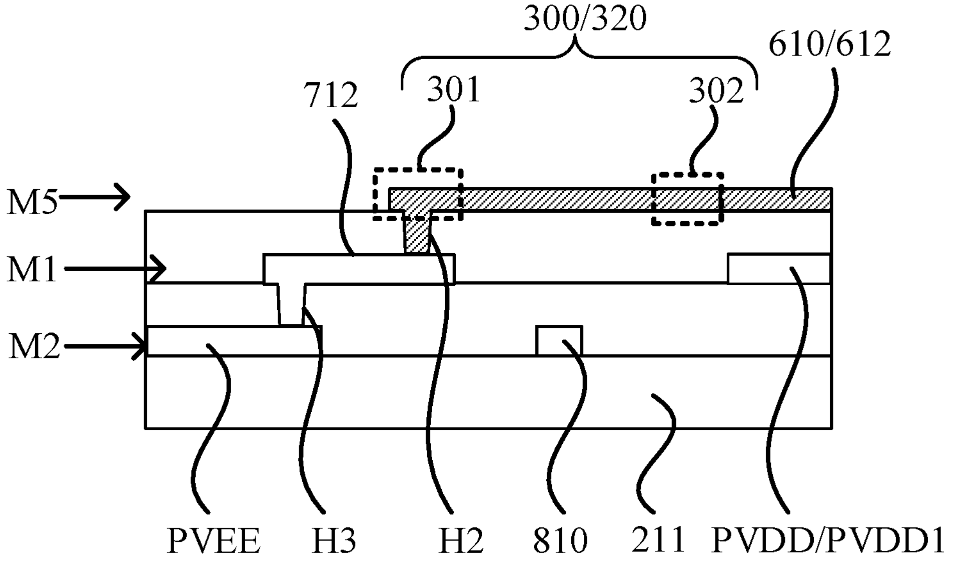
FIG. 21 is a sectional view taken along the CC' direction of FIG. 20.

FIG. 20 is a top view of another second region according to an embodiment of the present invention. FIG. 21 is a sectional view taken along the CC' direction of FIG. 20. Referring to FIGS. 20 and 21, the marks 300 are electrically connected to the second electrode pad 612. The first metal layer M1 includes a second connection portion 712. The second connection portion 712 is located in the multiple sub-pixel regions 500. The second metal layer M2 includes the first power line PVEE. The marks 300 are electrically connected to the second connection portion 712 through a second connection via H2. The second connection via H2 is electrically connected to the first power line PVEE through a third connection via H3. The second connection portion 712 is electrically connected to the first power line PVEE through the third connection via H3. In this embodiment of the present invention, the marks 300 and the second electrode pad 612 are electrically connected in the same layer, and the marks 300 are further electrically connected to the second connection portion 712 of the first metal layer M1 through the second connection via H2, thereby using the marks 300 to electrically connect the second electrode pad 612 and the second connection portion 712 and further electrically connecting the second electrode pad 612 and the first power line PVEE.

In an embodiment, referring to FIGS. 5, 7, 20 and 21, the array substrate includes the drive transistor T3 and the first reset transistor T5. The second metal layer M2 further includes a first reset signal connection line 810. The first electrode of the first reset transistor T5 is electrically connected to the gate of the drive transistor T3. The second electrode of the first reset transistor T5 is electrically connected to the first reset signal connection line 810 and is electrically connected to the first reset signal line VREF1 through the first reset signal connection line 810. The first reset signal connection line 810 and the first power line PVEE extend along the second direction Y. Along the first direction X, in the same one sub-pixel region 500, the first reset signal connection line 810 is located on one side of the first power line PVEE. The second mark 320 includes the first portion 301 and the second portion 302 that are arranged along the first direction X. In the direction perpendicular to the plane on which the substrate 211 is located, the first portion 301 overlaps the second connection via H2. Along the first direction X, in the same one sub-pixel region 500, the first mark 310 and the first power line PVEE are located on the same side of the first reset signal connection line 810. Along the first direction X, in the same one sub-pixel region 500, the first portion 301 and the second portion 302 are located on two sides of the first reset signal connection line 810 respectively. In this embodiment of the present invention, the shape of the first mark 310 in same one the sub-pixel region 500 is different from the shape of the second mark 320 in same one the sub-pixel region 500. Different arrangement patterns are formed by differentiating the shapes of the marks 300 in the same one sub-pixel region 500.

In an embodiment, referring to FIGS. 20 and 21, along the first direction X, in the same one sub-pixel region 500, a second connection via H2 connecting the first mark 310 is located on the first side of the first reset signal connection line 810. Along the first direction X, in the same one sub-pixel region 500, a second connection via H2 connecting the second mark 320 is located on the first side of the first reset signal connection line 810. The position of the second connection via H2 connecting the first mark 310 in the same one sub-pixel region 500 is the same as the position of the second connection via H2 connecting the second mark 320 in the same one sub-pixel region 500, so there is no need to change the positions of the second connection vias H2. Similarly, there is also no need to change the positions of the third connection vias H3. Details are not repeated herein. Therefore, there is no need to change the positions of lines and holes that are connected to the second connection vias H2 and the positions of lines and holes that are connected to the third connection vias H3, reducing the preparation difficulty of the array substrate.

In an embodiment, referring to FIGS. 20 and 21, in the direction perpendicular to the plane on which the substrate 211 is located, the second connection via H2 and the third connection via H3 are staggered and do not overlap. Therefore, the depth of a connection via at a single position can be reduced, the depression caused by disposing a connection via can be reduced, the flatness of the fifth metal layer M5 can be improved, a flat bonding interface can be provided for the light-emitting diode, and the bonding yield can be improved.

Figure 22:
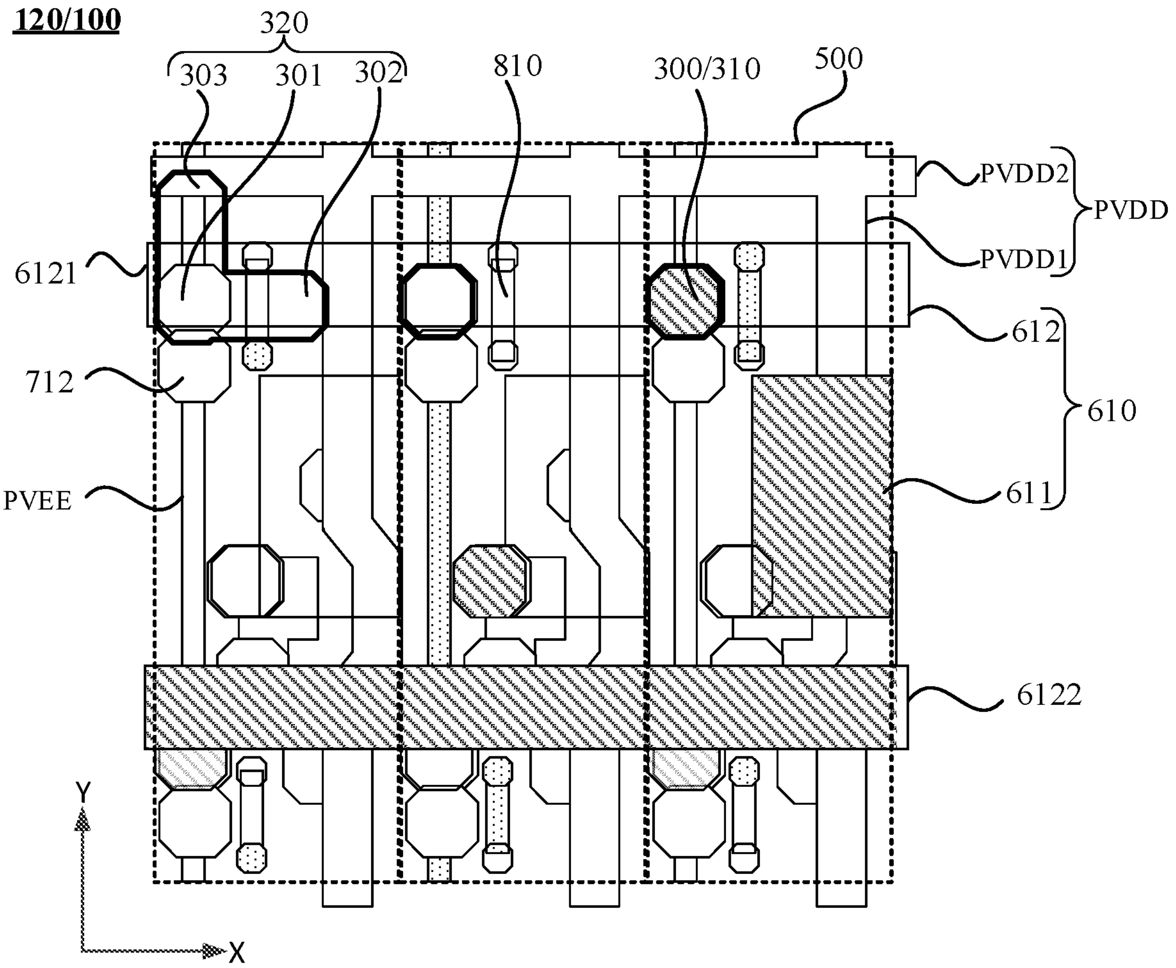
FIG. 22 is a top view of another second region according to an embodiment of the present invention.

FIG. 22 is a top view of another second region according to an embodiment of the present invention. Referring to FIG. 22, the second mark 320 includes the first portion 301, the second portion 302 and a third portion 303. The first portion 301, the second portion 302 and the third portion 303 are three ends of the second mark 320. Along the second direction Y, the minimum distance from the first portion 301 to the first electrode pad 611 is less than the minimum distance from the third portion 303 to the first electrode pad 611. The first portion 301 and the third portion 303 are arranged along the second direction Y. The second mark 320 is L-shaped so that the differences between the area of the second mark 320 and the area of the first mark 310 can be increased, and the differences between the shape of the second mark 320 and the shape of the first mark 310 can be increased, thereby increasing the recognition accuracy.

In an embodiment, referring to FIG. 22, along the second direction Y, in the same one sub-pixel region 500, the first portion 301 and the third portion 303 are located on two sides of the first electrode sub-pad 6121.

Figure 23:
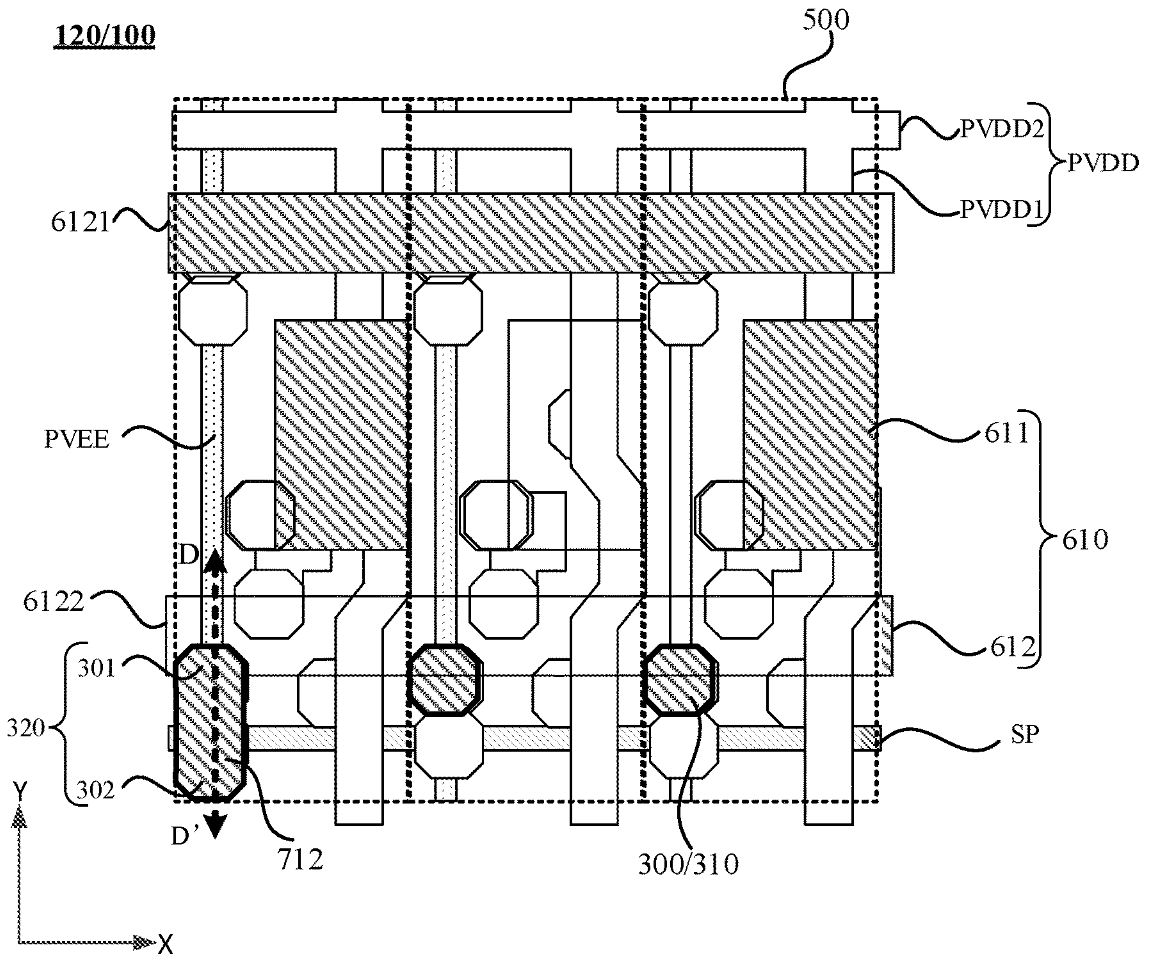
FIG. 23 is a top view of another second region according to an embodiment of the present invention.
Figure 24:
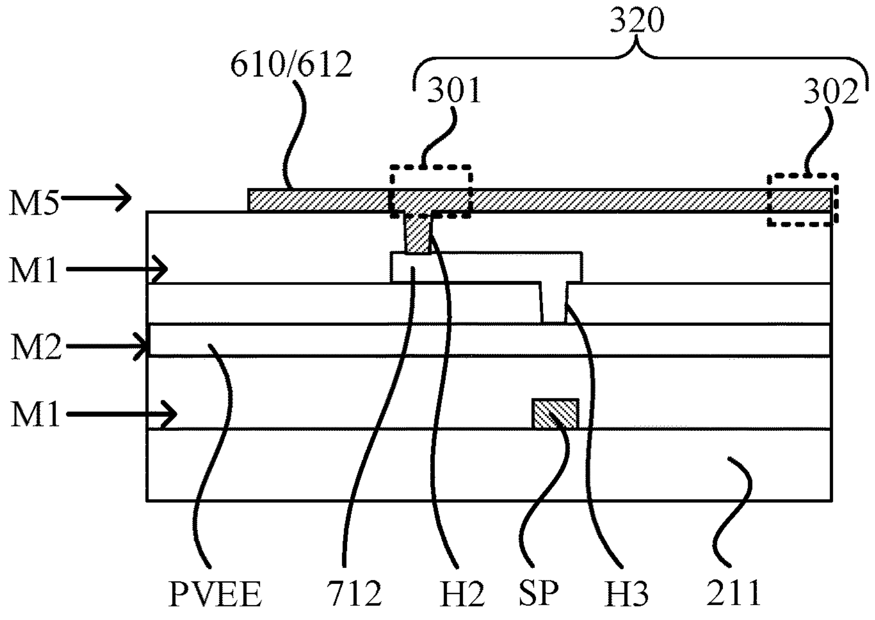
FIG. 24 is a sectional view taken along the DD' direction of FIG. 23.

FIG. 23 is a top view of another second region according to an embodiment of the present invention. FIG. 24 is a sectional view taken along the DD' direction of FIG. 23. Referring to FIGS. 23 and 24, the adjustment control signal line SP extends along the first direction X and is located between the second metal layer M2 and the substrate 211. Along the second direction Y, in the same one sub-pixel region 500, the adjustment control signal line SP is located on the same side of the first electrode pad 611 and the second electrode pad 612. The second mark 320 includes the first portion 301 and the second portion 302 that are arranged along the second direction Y. In the direction perpendicular to the plane on which the substrate 211 is located, the first portion 301 overlaps the second connection via H2. Along the second direction Y, in the same one sub-pixel region 500, the first mark 310 is located between the second electrode pad 612 and the adjustment control signal line SP. Along the second direction Y, in the same one sub-pixel region 500, the first portion 301 and the second portion 302 are located on two sides of the adjustment control signal line SP respectively. In this embodiment of the present invention, the shape of the first mark 310 in the same one sub-pixel region 500 is different from the shape of the second mark 320 in the same one sub-pixel region 500. Different arrangement patterns are formed by differentiating the shapes of the marks 300 in the same one sub-pixel region 500.

In an embodiment, referring to FIGS. 23 and 24, along the second direction Y, in the same one sub-pixel region 500, the first mark 310 is located between the second electrode sub-pad 6122 and the adjustment control signal line SP. Along the second direction Y, in the same one sub-pixel region 500, the first portion 301 is located between the second electrode sub-pad 6122 and the adjustment control signal line SP, and the second portion 302 is located on one side of the adjustment control signal line SP facing away from the second electrode sub-pad 6122.

In an embodiment, referring to FIGS. 23 and 24, along the second direction Y, in the same one sub-pixel region 500, the second connection via H2 connecting the first mark 310 is located between the second electrode pad 612 and the adjustment control signal line SP. Along the second direction Y, in the same one sub-pixel region 500, the second connection via H2 connecting the second mark 320 is located between the second electrode pad 612 and the adjustment control signal line SP. The position of the second connection via H2 connecting the first mark 310 in the same one sub-pixel region 500 is the same as the position of the second connection via H2 connecting the second mark 320 in the same one sub-pixel region 500, so there is no need to change the positions of the second connection vias H2. Similarly, there is also no need to change the positions of the third connection vias H3. Details are not repeated herein.

Figure 25:
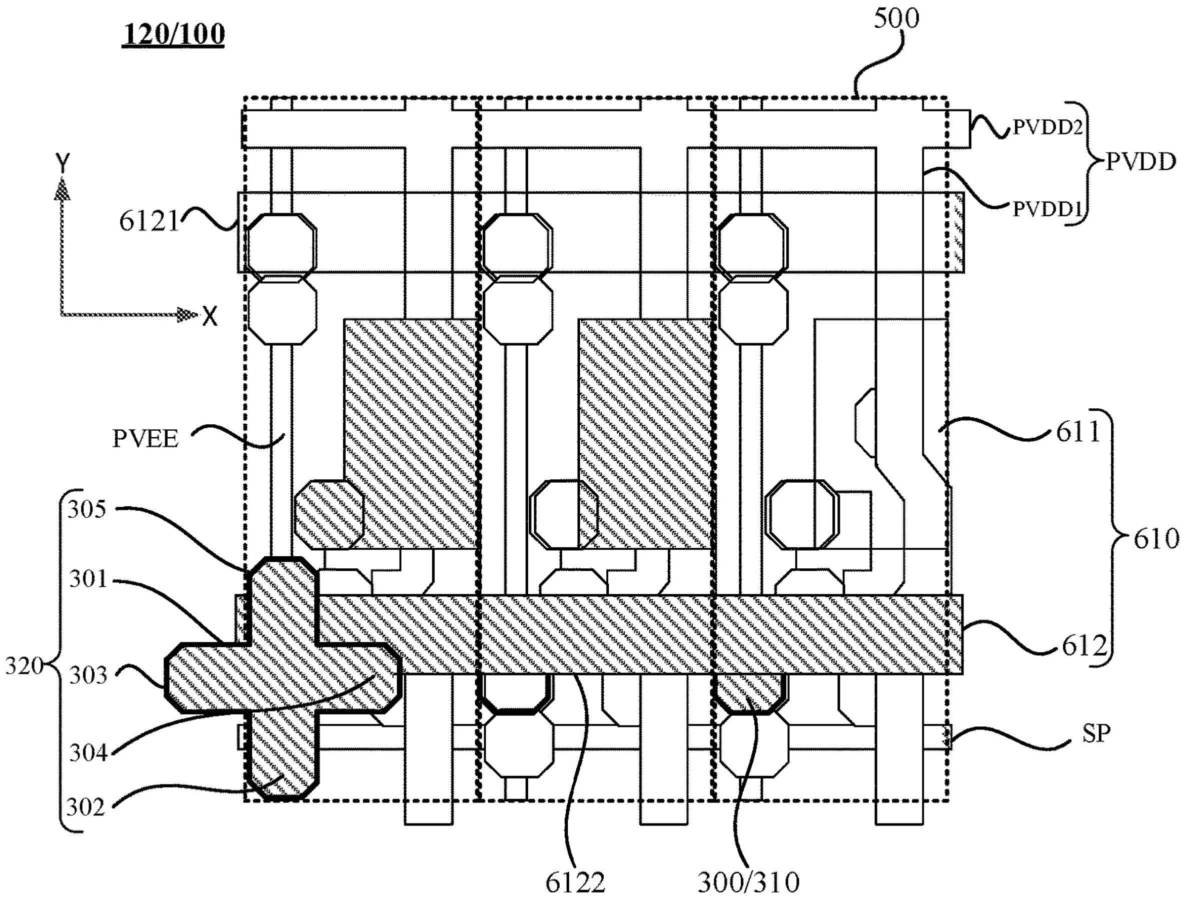
FIG. 25 is a top view of another second region according to an embodiment of the present invention.

FIG. 25 is a top view of another second region according to an embodiment of the present invention. Referring to FIG. 25, the second mark 320 further includes the third portion 303, a fourth portion 304 and a fifth portion 305. Along the second direction Y, the first portion 301 is located between the second portion 302 and the fifth portion 305. Along the first direction X, the first portion 301 is located between the third portion 303 and the fourth portion 304. Along the first direction X, in the same one sub-pixel region 500, the minimum distance from the fourth portion 304 to the first branch line PVDD1 is less than the minimum distance from the first portion 301 to the first branch line PVDD1. Along the second direction Y, in the same one sub-pixel region 500, the minimum distance from the fifth portion 305 to the first electrode pad 611 is less than the minimum distance from the first portion 301 to the first electrode pad 611. The second mark 320 is cross-shaped so that the differences between the area of the second mark 320 and the area of the first mark 310 can be increased, and the differences between the shape of the second mark 320 and the shape of the first mark 310 can be increased, thereby increasing the recognition accuracy.

In an embodiment, referring to FIG. 25, along the first direction X, the third portion 303 and the fourth portion 304 are located on two sides of the first power line PVEE. Along the second direction Y, the second portion 302 and the fifth portion 305 are located on two sides of the second electrode sub-pad 6122.

In an embodiment, referring to FIGS. 23 and 24, the second electrode pad 612 is connected to the second connection portion 712 through the second connection via H2, and the second connection portion 712 is connected to the first power line PVEE through the third connection via H3. Multiple first power lines PVEE extend along the second direction Y and are arranged along the first direction X. The multiple second electrode pads 612 extend along the first direction X and are arranged along the second direction Y. The multiple first power lines PVEE and the multiple second electrode pads 612 are electrically connected through connection vias to form a metal grid, reducing the voltage drops of negative power voltages on the multiple second electrode pads 612.

Figure 26:
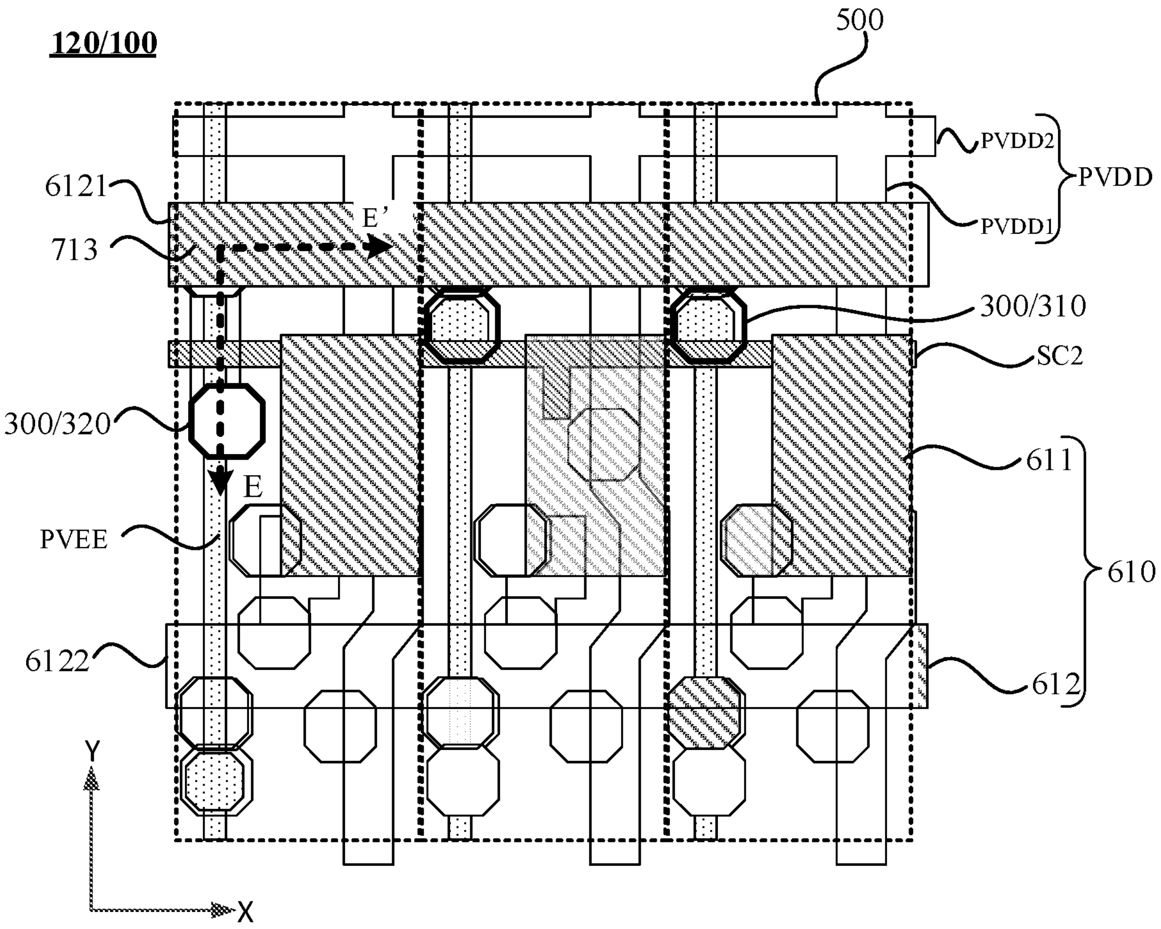
FIG. 26 is a top view of another second region according to an embodiment of the present invention.
Figure 27:
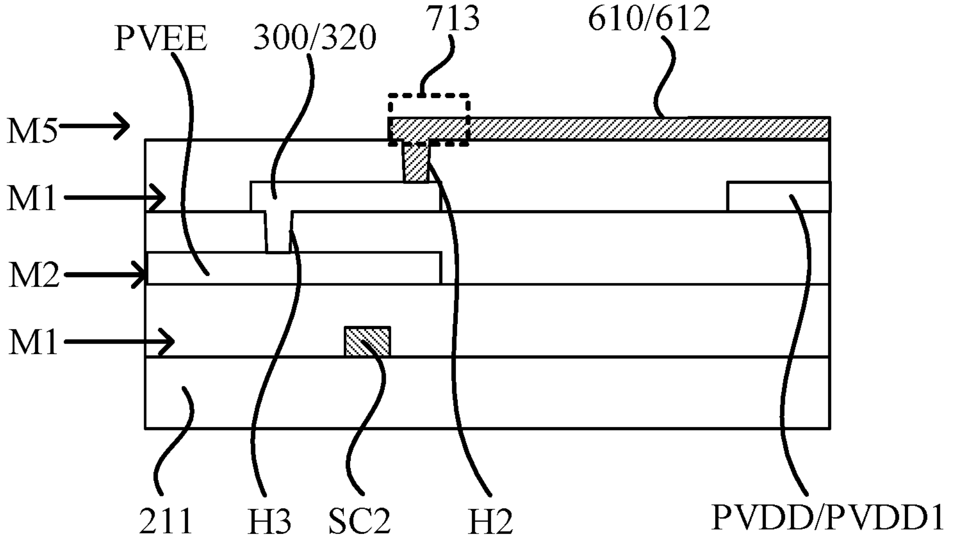
FIG. 27 is a sectional view taken along the EE' direction of FIG. 26.

FIG. 26 is a top view of another second region according to an embodiment of the present invention. FIG. 27 is a sectional view taken along the EE' direction of FIG. 26. Referring to FIGS. 26 and 27, the marks 300 are located between the electrode pad 610 and the substrate 211. In this embodiment of the present invention, the marks 300 may be disposed in a certain metal layer between the electrode pad 610 and the substrate 211.

In an embodiment, referring to FIGS. 26 and 27, the marks 300 are located in the first metal layer M1. The first metal layer M1 is a film on one side facing away from the substrate 211, and the marks 300 are not blocked by an insulating layer between the first metal layer M1 and the substrate 211, thereby improving the intensity of reflected light formed by the marks 300, improving the contrast ratio in an image taken by the machine and increasing the recognition accuracy.

In an embodiment, referring to FIGS. 26 and 27, the array substrate includes a third connection portion 713. The third connection portion 713 is located in the multiple sub-pixel regions 500. The third connection portion 713 and the second electrode pad 612 are electrically connected in the same layer. The third connection portion 713 and the second electrode pad 612 are located in the fifth metal layer M5. The marks 300 are located in the first metal layer M1. The second metal layer M2 includes the first power line PVEE configured to supply a negative power voltage. The marks 300 are electrically connected to the third connection portion 713 through a second connection via H2 and are electrically connected to the first power line PVEE through a third connection via H3. In this embodiment of the present invention, the second electrode pad 612 is electrically connected to the first power line PVEE through the marks 300.

In an embodiment, referring to FIGS. 26 and 27, the array substrate includes the second scan signal line SC2 extending along the first direction X. Along the second direction Y, the second scan signal line SC2 is located on one side of the third connection portion 713 facing away from the first electrode sub-pad 6121. Along the second direction Y, in the same one sub-pixel region 500, the first mark 310 is located between the first electrode sub-pad 6121 and the second scan signal line SC2. Along the second direction Y, in the same one sub-pixel region 500, the second mark 320 is at least partially located on one side of the second scan signal line SC2 facing away from the first electrode sub-pad 6121.

Figure 28:
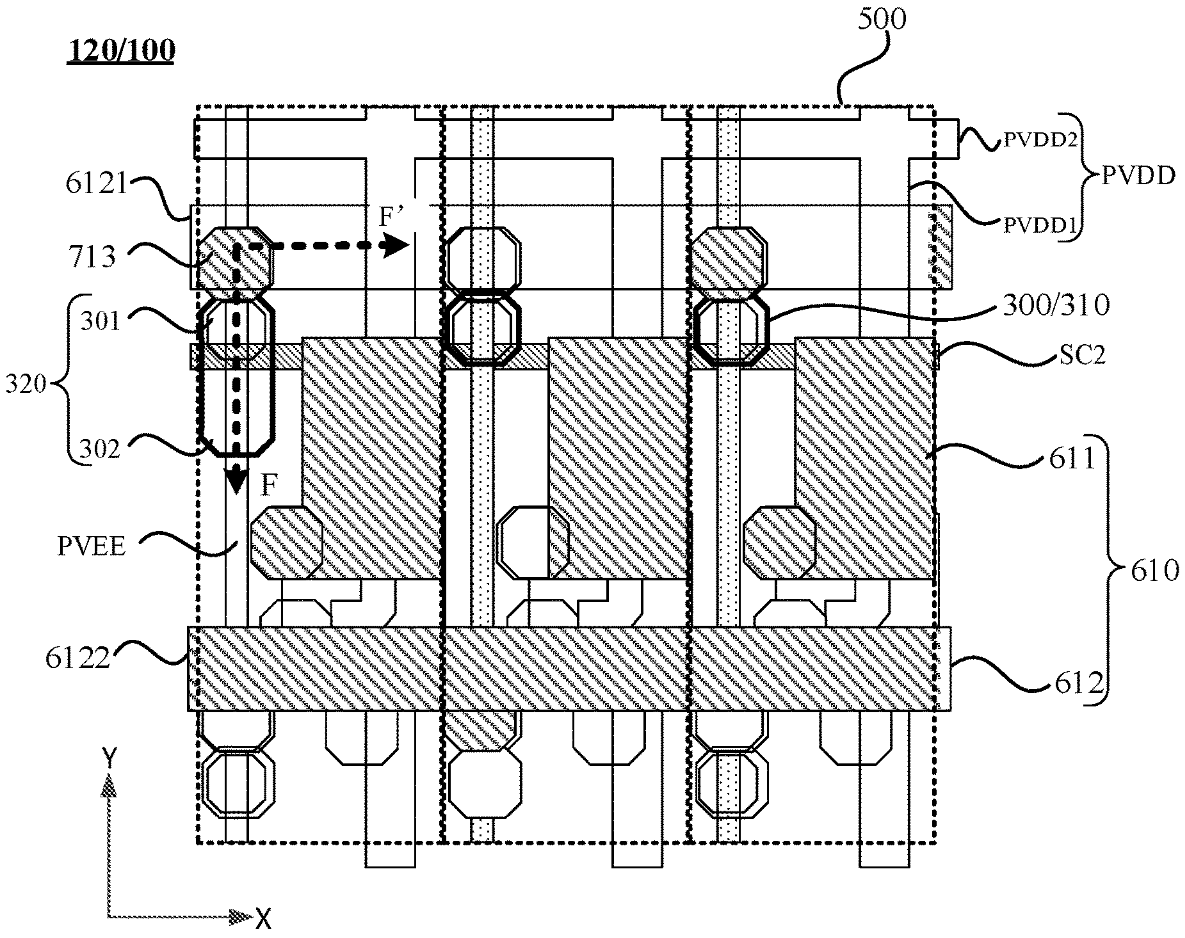
FIG. 28 is a top view of another second region according to an embodiment of the present invention.
Figure 29:
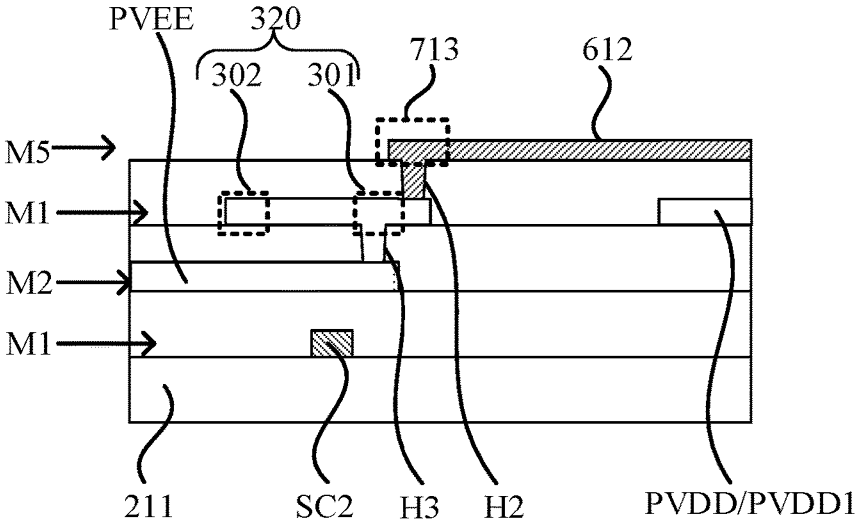
FIG. 29 is a sectional view taken along the FF' direction of FIG. 28.

FIG. 28 is a top view of another second region according to an embodiment of the present invention. FIG. 29 is a sectional view taken along the FF' direction of FIG. 28. Referring to FIGS. 28 and 29, the second mark 320 includes the first portion 301 and the second portion 302 that are arranged along the second direction Y. In the direction perpendicular to the plane on which the substrate 211 is located, the first portion 301 overlaps the third connection via H3. Along the second direction Y, in the same one sub-pixel region 500, the first mark 310 is located between the first electrode sub-pad 6121 and the second scan signal line SC2. Along the second direction Y, in the same one sub-pixel region 500, the first portion 301 and the second portion 302 are located on two sides of the second scan signal line SC2 respectively.

Figure 30:
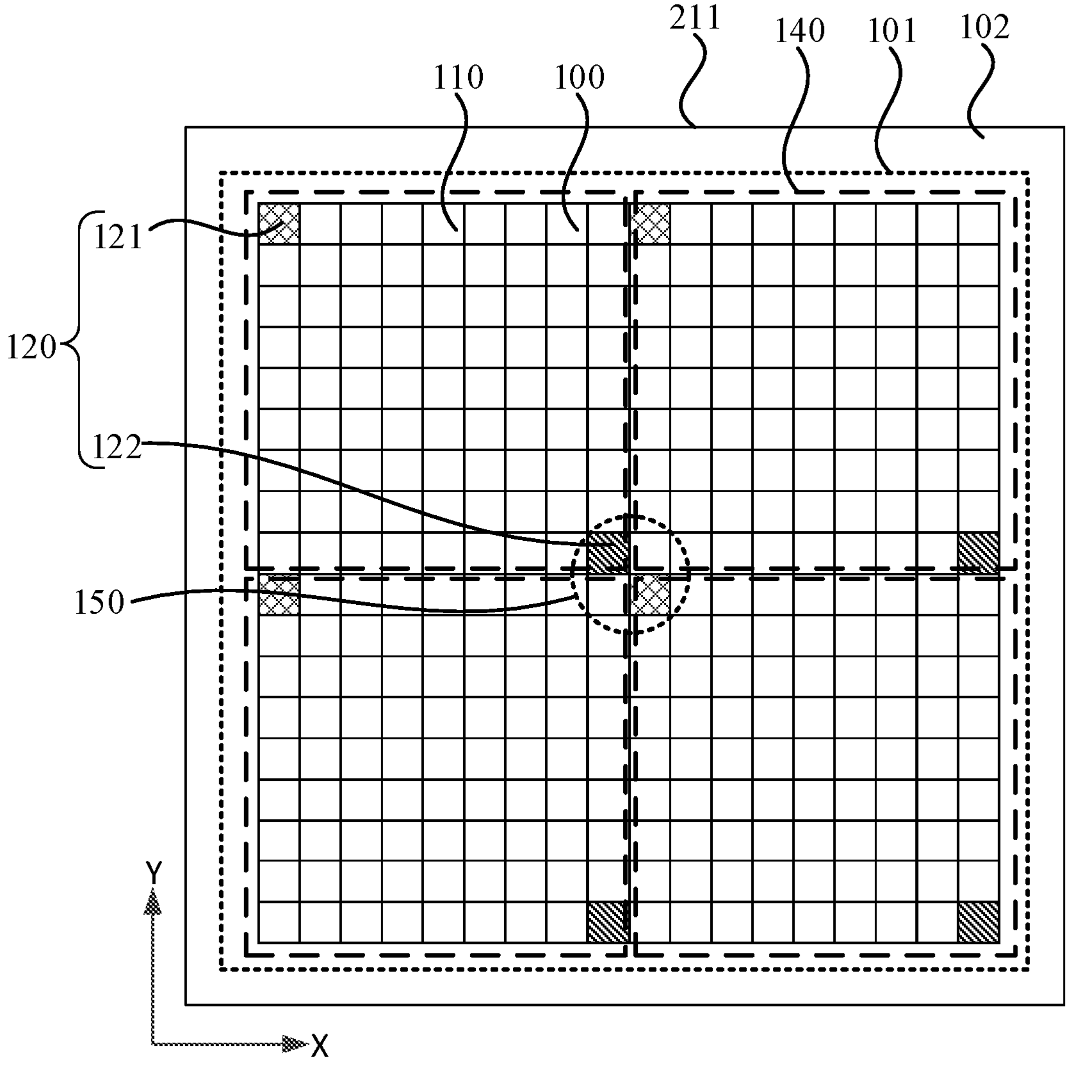
FIG. 30 is a top view of another array substrate according to an embodiment of the present invention.
Figure 31:
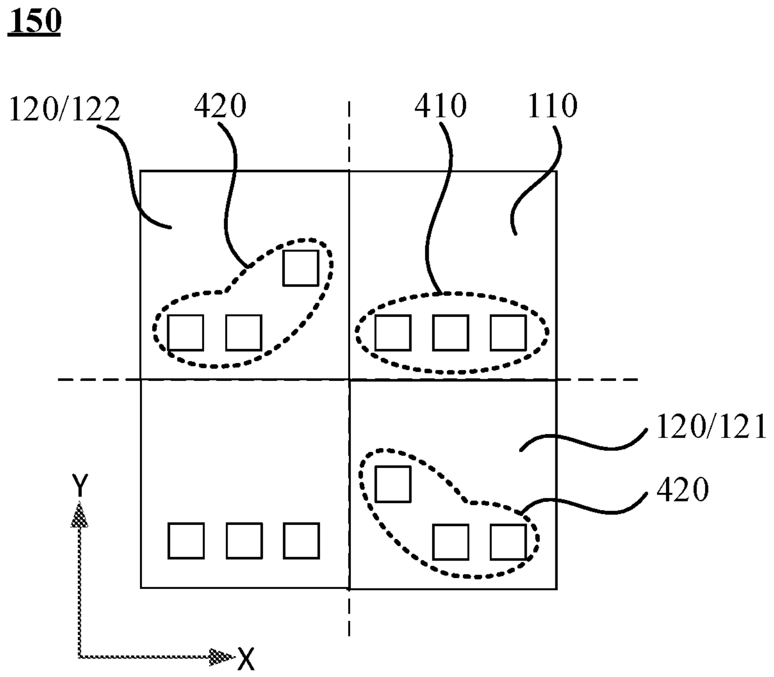
FIG. 31 is an enlarged diagram illustrating the structure of region 150 of FIG. 30.

FIG. 30 is a top view of another array substrate according to an embodiment of the present invention. FIG. 31 is an enlarged diagram illustrating the structure of region 150 of FIG. 30. Referring to FIGS. 30 and 31, the pixel disposition region 101 includes at least one pickup transfer region 140. A pickup transfer region 140 corresponds to a region on the array substrate that bears multiple light-emitting diodes for one transfer when light-emitting diodes are transferred. In some embodiments, the pixel disposition region 101 of the array substrate includes multiple pickup transfer regions 140, so the light-emitting diodes need to be transferred multiple times to fully fill the pixel disposition region 101.

The pickup transfer region 140 includes at least part of the first region 110 and at least two second regions 120. Two second regions 120 in the same one pickup transfer region 140 are a first sub-region 121 and a second sub-region 122 respectively. The pickup transfer region 140 is rectangular, and the first sub-region 121 and the second sub-region 122 are located at diagonal positions of the pickup transfer region 140 respectively. In this embodiment of the present invention, the first sub-region 121 and the second sub-region 122 are located at the diagonal positions of the pickup transfer region 140 respectively, and the first sub-region 121 and the second sub-region 122 are used for distinguishing the pickup transfer region 140 in which the first sub-region 121 and the second sub-region 122 are located from adjacent pickup transfer regions 140. The first sub-region 121 serves as a start alignment mark in the pickup transfer region 140, the second sub-region 122 serves as an end alignment mark in the pickup transfer region 140, and the first sub-region 121 and the second sub-region 122 are used for limiting the start position and the end position of the pickup transfer region 140, thereby limiting the range of the pickup transfer region 140.

It is to be noted that the array substrate according to this embodiment of the present invention is applicable to non-rectangular display panels such as a circular display panel. For an array substrate forming a circular display panel, rectangular pickup transfer regions 142 also need to be disposed. When the light-emitting diodes are transferred, a light-emitting diode array in a rectangular arrangement as a whole is transferred, and there are no devices bonded with the light-emitting diodes outside of the circular range, so the light-emitting diodes fall off. Within the circular range, the light-emitting diodes are securely connected to the array substrate. After the array substrate outside of the circular range is cut, the circular display panel is formed.

In an embodiment, referring to FIGS. 30 and 31, the second arrangement pattern 420 in the first sub-region 121 is different from the second arrangement pattern 420 in the second sub-region 122. Since the second sub-region 122 is relatively close to the first sub-region 121 in the diagonally adjacent pickup transfer region 140, if the second arrangement pattern 420 in the first sub-region 121 is the same as the second arrangement pattern 420 in the second sub-region 122, an erroneous recognition easily occurs by regarding the second sub-region 122 in a pickup transfer region 140 as the first sub-region 121 in the diagonally adjacent pickup transfer region 140. Similarly, an erroneous recognition easily occurs by regarding the first sub-region 121 in a pickup transfer region 140 as the second sub-region 122 in the diagonally adjacent pickup transfer region 140. In this embodiment of the present invention, the second arrangement pattern 420 in the first sub-region 121 is different from the second arrangement pattern 420 in the second sub-region 122, increasing recognition accuracy of the at least one pickup transfer region 140.

Figure 32:
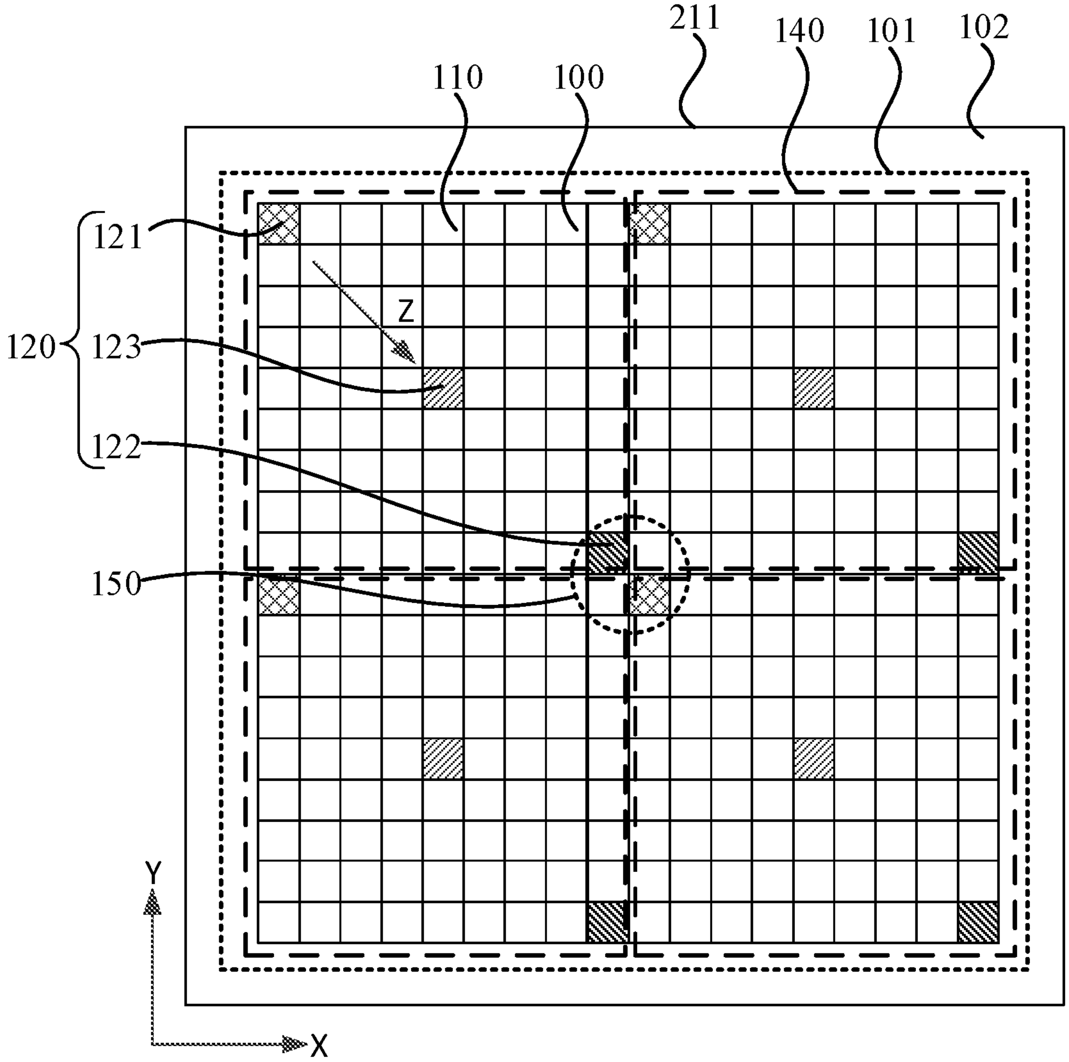
FIG. 32 is a top view of another array substrate according to an embodiment of the present invention.

FIG. 32 is a top view of another array substrate according to an embodiment of the present invention. Referring to FIG. 32, multiple second regions 120 include the first sub-region 121, the second sub-region 122 and a third sub-region 123. In the same one pickup transfer region 140, the first sub-region 121, the second sub-region 122 and the third sub-region 123 are arranged along a third direction Z. The third sub-region 123 is located between the first sub-region 121 and the second sub-region 122. The third direction Z is different from the first direction X and the second direction Y. The first sub-region 121 and the second sub-region 122 determine one straight line. When the positions of the first sub-region 121 and/or the second sub-region 122 recognized by the machine are offset with respect to the actual positions of the first sub-region 121 and the second sub-region 122 on the array substrate, in the image recognized by the machine, the first sub-region 121, the second sub-region 122 and the third sub-region 123 are no longer arranged along the third direction Z, and the third sub-region 123 is offset from the straight line determined by the first sub-region 121 and the second sub-region 122. In this embodiment of the present invention, the first sub-region 121, the second sub-region 122 and the third sub-region 123 are disposed, increasing alignment accuracy of the light-emitting diodes with the array substrate.

In an embodiment, referring to FIG. 32, the geometric centers of the first sub-region 121, the second sub-region 122, and the third sub-region 123 are collinear. In other embodiments, the geometric centers of the first sub-region 121, the second sub-region 122, and the third sub-region 123 may not be collinear.

Figure 33:
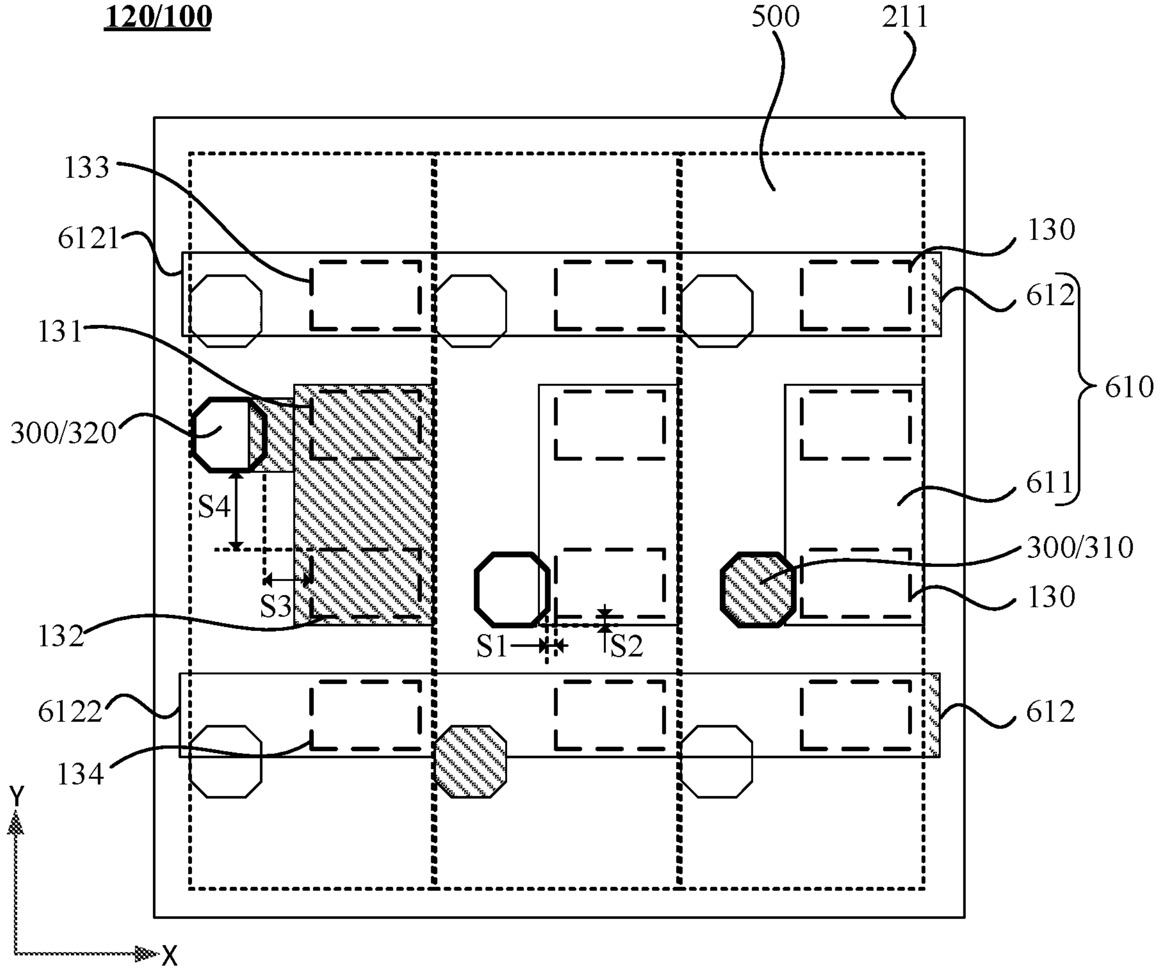
FIG. 33 is a top view of another second region according to an embodiment of the present invention.

FIG. 33 is a top view of another second region according to an embodiment of the present invention. Referring to FIG. 33, the minimum distance from the first mark 310 to the same one overlapping region 130 of the first electrode pad 611 in the same one sub-pixel region 500 along the first direction X is S1. The minimum distance from the first mark 310 to the same one overlapping region 130 of the first electrode pad 611 in the same one sub-pixel region 500 along the second direction Y is S2. The minimum distance from the second mark 320 to the same one overlapping region 130 of the first electrode pad 611 in the same one sub-pixel region 500 is S3 along the first direction X and is S4 along the second direction Y. S1≠S3, and S2≠S4. In other embodiments, S1≠S3, or S26≠S4. That is, the position of the first mark 310 in the same one sub-pixel region 500 along the first direction X is different from the position of the second mark 320 in the same one sub-pixel region 500 along the first direction X, and/or the position of the first mark 310 in the same one sub-pixel region 500 along the second direction Y is different from the position of the second mark 320 in the same one sub-pixel region 500 along the second direction Y.

In an embodiment, referring to FIG. 18, the orthographic projection area of the first mark 310 on the substrate 211 is less than the orthographic projection area of the second mark 320 on the substrate 211. The larger the difference between the orthographic projection area of the second mark 320 on the substrate 211 and the orthographic projection area of the first mark 310 on the substrate 211, the larger the difference between the shape of the second mark 320 and the shape of the first mark 310, so the better the recognition accuracy.

It is to be understood that in some embodiments, the positions of the marks 300 in the same one sub-pixel region 500 and the areas of the marks 300 may be changed. In this case, the positions of the connection vias connecting the marks 300 and the areas of the marks 300 are changed.

In an embodiment, referring to FIGS. 1 and 2, in the first region 110, at least two pixel regions 100 have the same one first arrangement pattern 410. The first region 110 is a conventional pixel region 100, and the second region 120 is a pixel region 100 for accommodating the alignment mark. During recognition, the machine determines the positions for alignment on the array substrate by acquiring the position of the second arrangement pattern 420 in the second region 120.

In an embodiment, referring to FIGS. 1 and 2, the first arrangement pattern 410 and the second arrangement pattern 420 occupy the same number of pixel regions 100. The first arrangement pattern 410 and the second arrangement pattern 420 include the same number of marks 300.

In an embodiment, referring to FIG. 1, the first arrangement pattern 410 occupies one pixel region 100 and is formed by arranging two marks 300 in the one pixel region 100. The second arrangement pattern 420 occupies one pixel region 100 and is formed by arranging two marks 300 in the one pixel region 100.

In an embodiment, referring to FIG. 2, the first arrangement pattern 410 occupies one pixel region 100 and is formed by arranging three marks 300 in the one pixel region 100. The second arrangement pattern 420 occupies one pixel region 100 and is formed by arranging three marks 300 in the one pixel region 100. In other embodiments, the first arrangement pattern 410 and the second arrangement pattern 420 may also occupy multiple pixel regions 100.

Figure 34:
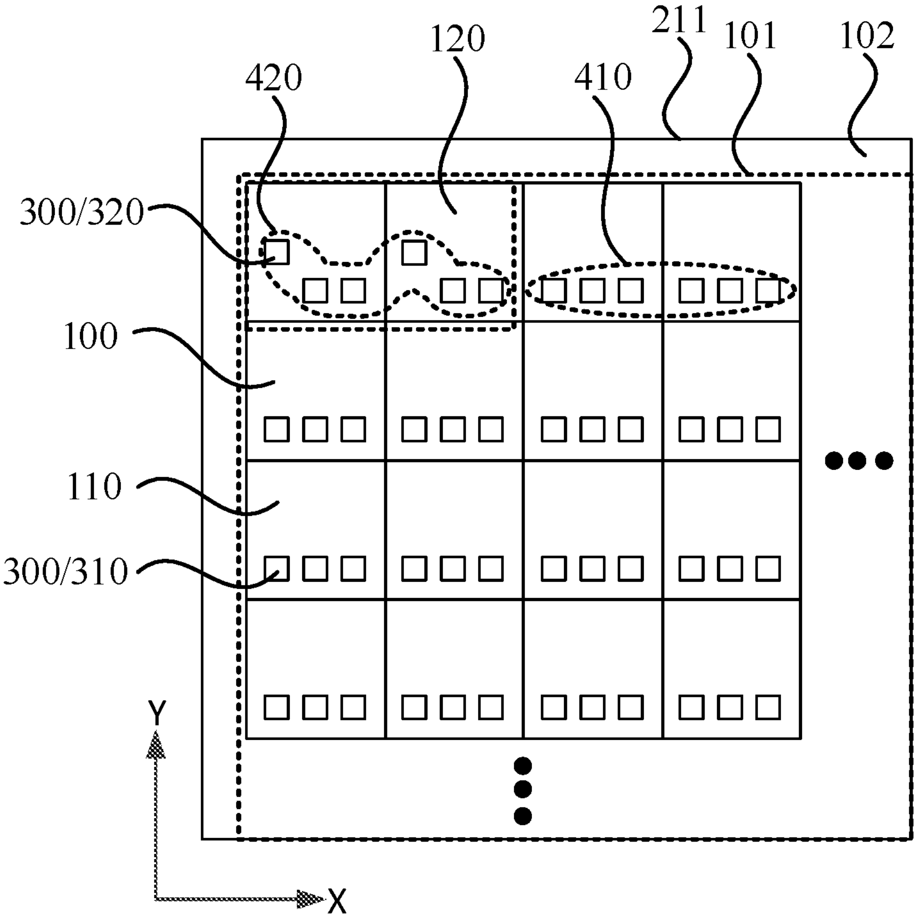
FIG. 34 is a top view of another array substrate according to an embodiment of the present invention.

FIG. 34 is a top view of another array substrate according to an embodiment of the present invention. Referring to FIG. 34, the first arrangement pattern 410 occupies two pixel regions 100 and is formed by arranging six marks 300 in the two pixel regions 100. The second arrangement pattern 420 occupies two pixel regions 100 and is formed by arranging six marks 300 in the two pixel regions 100.

Figure 35:
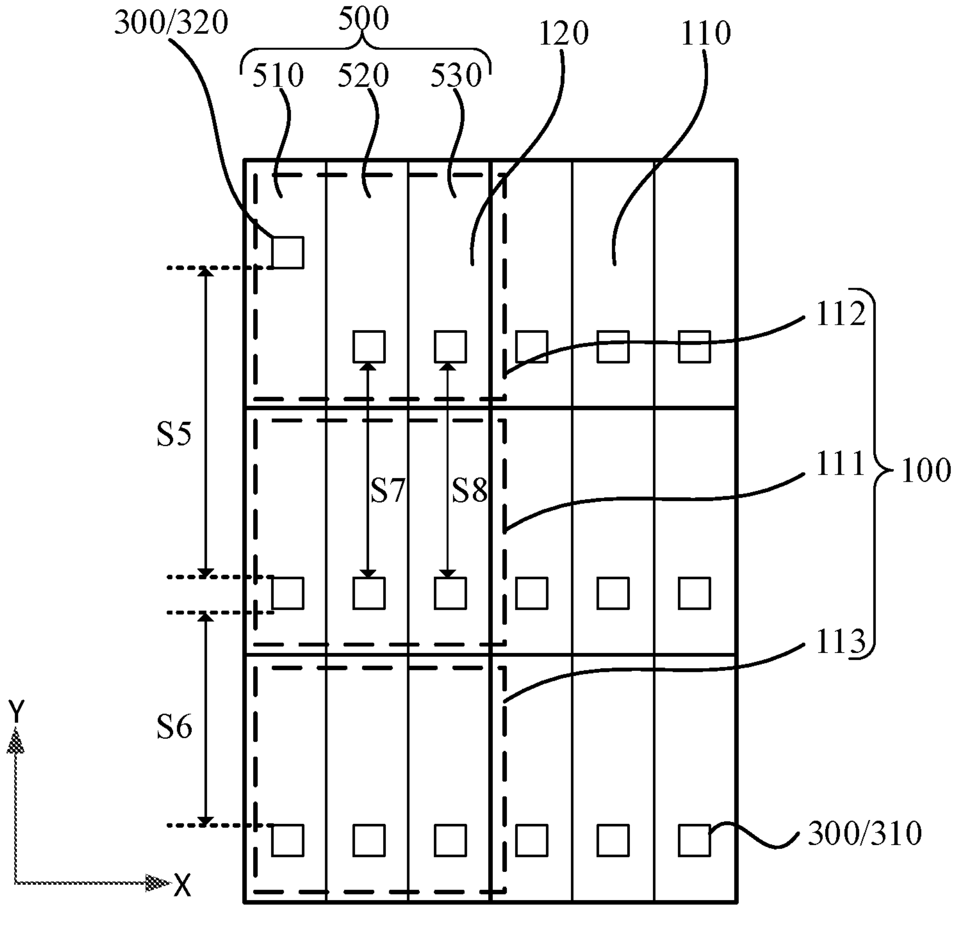
FIG. 35 is a top view of another array substrate according to an embodiment of the present invention.

FIG. 35 is a top view of another array substrate according to an embodiment of the present invention. Referring to FIGS. 2 and 35, the pixel region 100 includes the multiple sub-pixel regions 500. The marks 300 are located in the multiple sub-pixel regions 500. A sub-pixel region 500 in the pixel region 100 includes a first sub-pixel region 510. The same number of pixel regions 100 occupied by the first arrangement pattern 410 includes a first pixel region 111. The same number of pixel regions 100 occupied by the second arrangement pattern 420 includes a second pixel region 112. The first pixel region 111 and the second pixel region 112 are arranged adjacent to each other along the second direction Y. Along the second direction Y, the minimum distance from marks 300 in the first sub-pixel region 510 of the first pixel region 111 to marks 300 in the first sub-pixel region 510 of the second pixel region 112 is S5. The at least one pixel region 100 in the first region 110 further includes a third pixel region 113. The third pixel region 113 and the first pixel region 111 are arranged adjacent to each other along the second direction Y. The first pixel region 111 is located between the second pixel region 112 and the third pixel region 113. Along the second direction Y, the minimum distance from marks 300 in the first sub-pixel region 510 of the first pixel region 111 to marks 300 in the first sub-pixel region 510 of the third pixel region 113 is S6. S5 S6. In this embodiment of the present invention, the position of the first mark 310 in the first sub-pixel region 510 along the second direction Y is different from the position of the second mark 320 in the first sub-pixel region 510 along the second direction Y. Different marks 300 (including the first mark 310 and the second mark 320) are formed by differentiating the positions of the marks 300 in the first sub-pixel region 510, thereby forming different arrangement patterns.

In an embodiment, referring to FIGS. 2 and 35, the sub-pixel region 500 in the same one pixel region 100 further includes a second sub-pixel region 520 and a third sub-pixel region 530. The first sub-pixel region 510, the second sub-pixel region 520 and the third sub-pixel region 530 are arranged along the first direction X. Along the second direction Y, the minimum distance from marks 300 in the second sub-pixel region 520 of the first pixel region 111 to marks 300 in the second sub-pixel region 520 of the second pixel region 112 is S7. Along the second direction Y, the minimum distance from marks 300 in the third sub-pixel region 530 of the first pixel region 111 to marks 300 in the third sub-pixel region 530 of the second pixel region 112 is S8. S6=S7, and S6=S8. In this embodiment of the present invention, in the second region 120, the first sub-pixel region 510 includes the second mark 320, the second sub-pixel region 520 includes the first mark 310, and the third sub-pixel region 530 includes the first mark 310. The positions of the marks 300 in the first sub-pixel region 510 in the second region 120 vary with respect to the positions in the first sub-pixel region 510 in the first region 110. The positions of the marks 300 in the second sub-pixel region 520 in the second region 120 do not vary with respect to the positions in the second sub-pixel region 520 in the first region 110. The positions of the marks 300 in the third sub-pixel region 530 in the second region 120 do not vary with respect to the positions in the third sub-pixel region 530 in the first region 110. Therefore, the structure modification of the original array substrate can be reduced, and the preparation difficulty of the array substrate can be reduced.

Figure 36:
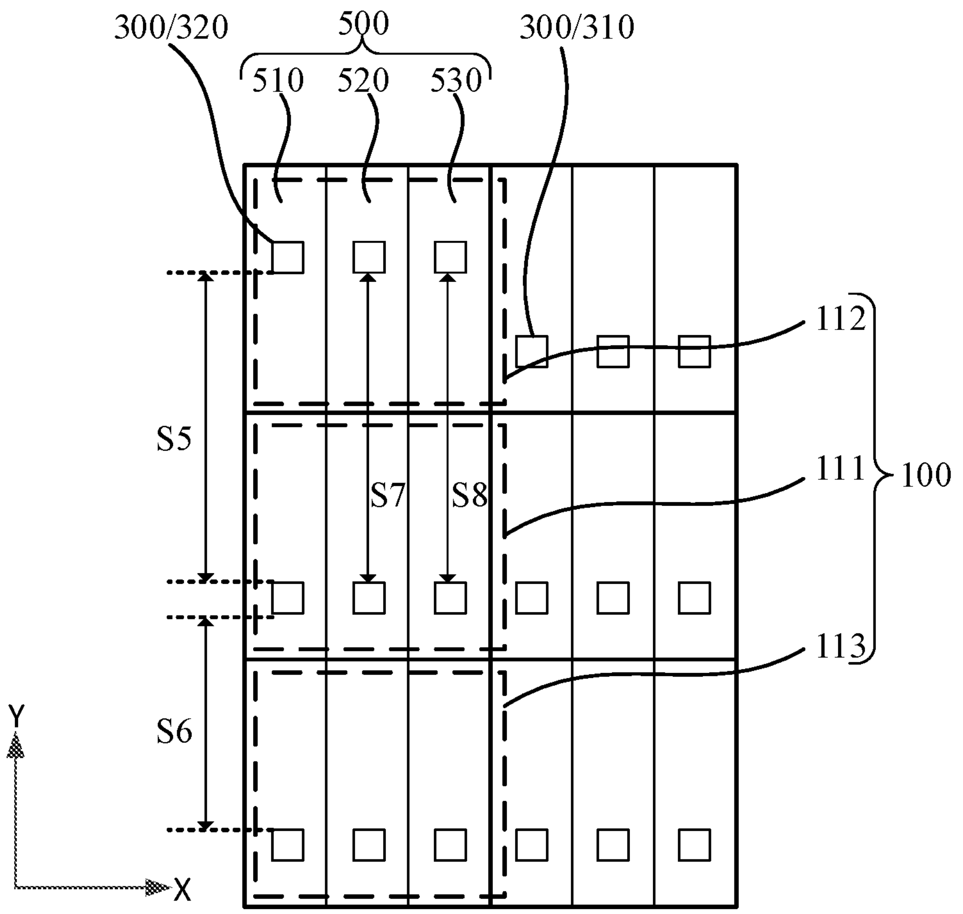
FIG. 36 is a top view of another array substrate according to an embodiment of the present invention.

FIG. 36 is a top view of another array substrate according to an embodiment of the present invention. Referring to FIGS. 36, S5≠S6, S5=S7, and S5=S8. Therefore, S7≠S6, and S8≠S6. In the second region 120, the first sub-pixel region 510 includes the second mark 320, the second sub-pixel region 520 includes the second mark 320, and the third sub-pixel region 530 includes the second mark 320. The positions of the marks 300 in the first sub-pixel region 510, the second sub-pixel region 520 and the third sub-pixel region 530 in the second region 120 vary with respect to the positions in the first sub-pixel region 510 in the first region 110. Therefore, the number of second marks 320 in the same one second region 120 can be increased, the differences between the shape of the second arrangement pattern 420 and the shape of the first arrangement pattern 410 can be increased, and the recognition accuracy can be increased. For another aspect, S5=S7, S5=S8, and the positions of the second mark 320 in the first sub-pixel region 510, the second sub-pixel region 520 and the third sub-pixel region 530 in the second region 120 are the same, thereby reducing the preparation difficulty of the array substrate.

In other embodiments, S5≠S6, S5=S7, and S6=S8, or S5≠S6, S5=S8, and S6=S7.

Figure 37:
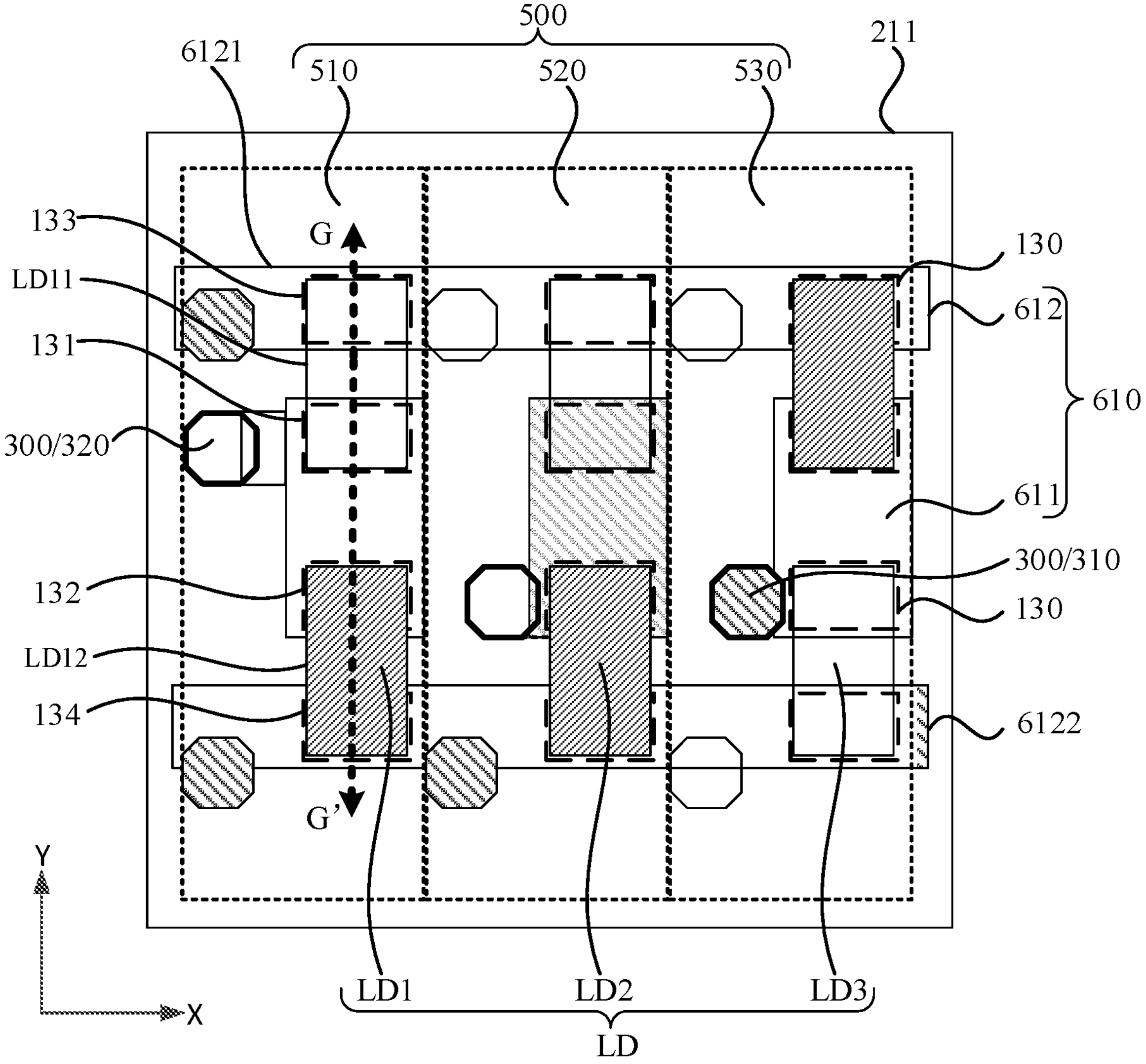
FIG. 37 is a top view of a display panel according to an embodiment of the present invention.
Figure 38:
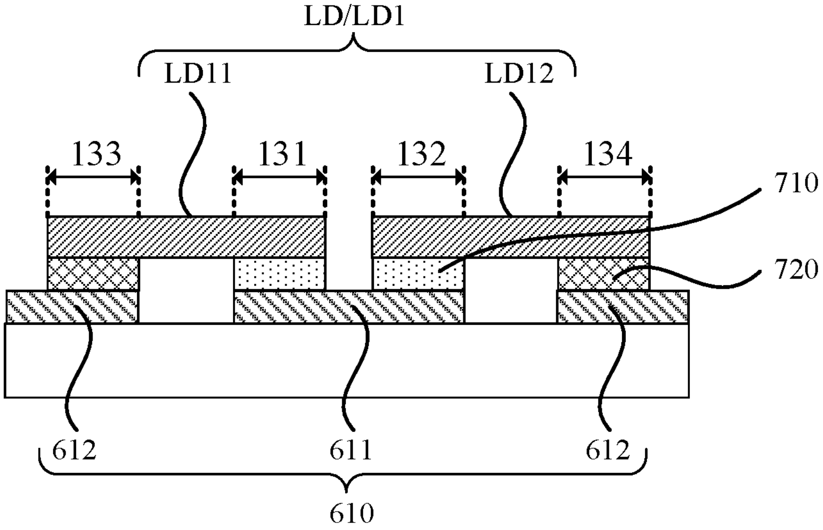
FIG. 38 is a sectional view taken along the GG' direction of FIG. 37.

FIG. 37 is a top view of a display panel according to an embodiment of the present invention. FIG. 38 is a sectional view taken along the GG' direction of FIG. 37. Referring to FIGS. 1, 37 and 38, the display panel includes the array substrate in the preceding embodiments and multiple light-emitting diodes LD. The multiple light-emitting diodes LD are disposed in the multiple pixel regions 100 on the array substrate. There is a difference between the first arrangement pattern 410 and the second arrangement pattern 420. Therefore, the first arrangement pattern 410 or the second arrangement pattern 420 can be used as an alignment mark to achieve the alignment of the multiple light-emitting diodes LD with the array substrate, so there is no need to dispose a special alignment mark on the array substrate, saving the space in the pixel disposition region 101.

In an embodiment, referring to FIGS. 33 and 37, the first electrode pad 611 includes the two overlapping regions 130 that are a first overlapping region 131 and a second overlapping region 132 respectively. The first electrode sub-pad 6121 includes a third overlapping region 133, and the second electrode sub-pad 6122 includes a fourth overlapping region 134. In the same one sub-pixel region 500, along the second direction Y, the first overlapping region 131 is located between the second overlapping region 132 and the third overlapping region 133, and the second overlapping region 132 is located between the first overlapping region 131 and the fourth overlapping region 134. The first overlapping region 131 and the third overlapping region 133 are mounted with the anode 710 and the cathode 720 of the same one light-emitting diode LD respectively. The second overlapping region 132 and the fourth overlapping region 134 are mounted with the anode 710 and the cathode 720 of the same one light-emitting diode LD respectively. Two light-emitting diodes LD are disposed in the same one sub-pixel region 500 and are denoted as a first light-emitting sub-diode LD11 and a second light-emitting sub-diode LD12 respectively. The anode 710 of the first light-emitting sub-diode LD11 and the anode 710 of the second light-emitting sub-diode LD12 are electrically connected to the same one first electrode pad 611. The first light-emitting sub-diode LD11 and the second light-emitting sub-diode LD12 are simultaneously lit or extinguished.

In an embodiment, referring to FIGS. 33 and 37, the multiple light-emitting diodes LD includes a first light-emitting diode LD1, a second light-emitting diode LD2 and a third light-emitting diode LD3. Any two of the first light-emitting diode LD1, the second light-emitting diode LD2 and the third light-emitting diode LD3 have different light-emitting colors. The first light-emitting diode LD1 is located in the first sub-pixel region 510, the second light-emitting diode LD2 is located in the second sub-pixel region 520, and the third light-emitting diode LD3 is located in the third sub-pixel region 530. The display panel can achieve a colorful display by mixing the light-emitting colors of the first light-emitting diode LD1, the second light-emitting diode LD2 and the third light-emitting diode LD3.

Figure 39:
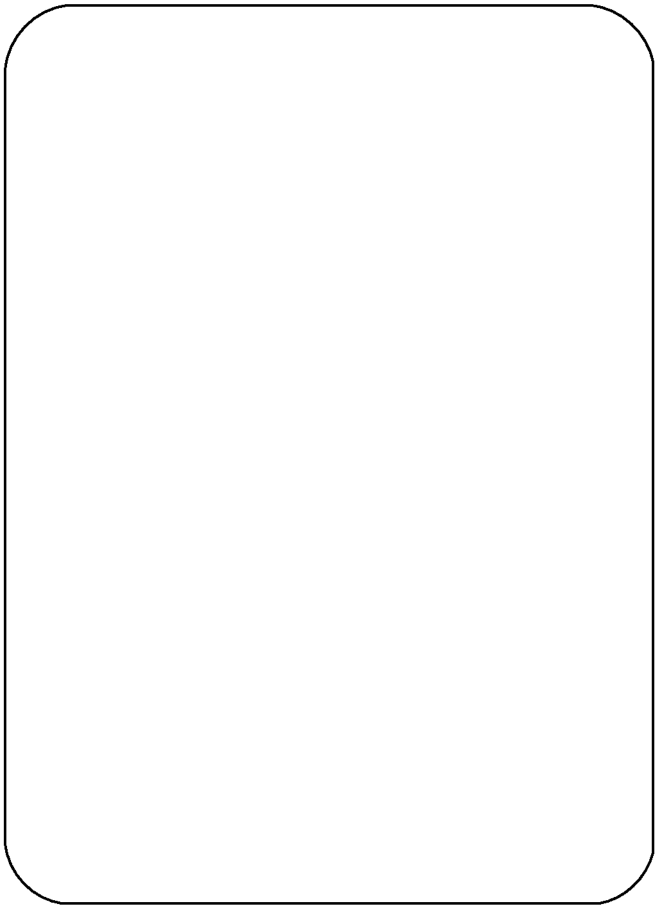
FIG. 39 is a diagram illustrating a display device according to an embodiment of the present invention.

FIG. 39 is a diagram illustrating a display device according to an embodiment of the present invention. Referring to FIG. 39, the display device includes the display panel described in the preceding embodiments. The display device according to this embodiment of the present invention may be a mobile phone or may be any electronic product having a display function, including, but not limited to, a television, a laptop, a desktop display, a tablet computer, a digital camera, a smart bracelet, smart glasses, a vehicle-mounted display, medical equipment, industrial control equipment and a touch interactive terminal. No special limitations are made thereto in this embodiment of the present invention.

It is to be noted that the preceding are only preferred embodiments of the present invention and technical principles used therein. It is to be understood by those skilled in the art that the present invention is not limited to the embodiments described herein. Those skilled in the art can make various apparent modifications, adaptations, combinations and substitutions without departing from the scope of the present invention. Therefore, while the present invention has been described in detail through the preceding embodiments, the present invention is not limited to the preceding embodiments and may include more other equivalent embodiments without departing from the concept of the present invention. The scope of the present invention is determined by the scope of the appended claims.

What is claimed is:

1. An array substrate, comprising:

a pixel disposition region, wherein the pixel disposition region comprises a plurality of pixel regions arranged along a first direction and a second direction, the first direction intersects the second direction;

and the pixel disposition region comprises a first region and a second region, and each of the first region and the second region comprise at least one pixel region of the plurality of pixel regions;

a substrate; and marks located on a side of the substrate and in the pixel disposition region, wherein a mark of the marks in the at least one pixel region in the first region has a first arrangement pattern, a mark of the marks in the at least one pixel region in the second region has a second arrangement pattern, and the first arrangement pattern is different from the second arrangement pattern, wherein a pixel region of the plurality of pixel regions comprises a plurality of sub-pixel regions;

the array substrate further comprises electrode pads located on a side of the substrate, an electrode pad of the electrode pads is at least partially located in a sub-pixel region of the plurality of sub-pixel regions and configured to be electrically connected to an electrode of a to-be-mounted light-emitting diode; and wherein the marks and the electrode pads are in a same layer.

2. The array substrate according to claim 1, wherein the electrode pad comprises an overlapping region being a light-emitting diode disposition region, and an orthographic projection of a mark of the marks on the substrate do not overlap an orthographic projection of a respective overlapping region on the substrate.

3. The array substrate according to claim 1, wherein the electrode pads comprise a plurality of first electrode pads arranged along the first direction and the second direction;

a mark of the marks is electrically connected to a respective first electrode pad of the plurality of first electrode pads; and the array substrate further comprises a first metal layer comprising a first connection portion, the first connection portion is located in the plurality of sub-pixels regions, the first metal layer is located between the substrate and the mark, and the mark is electrically connected to the first connection portion through a first connection via.

4. The array substrate according to claim 3, further comprising a storage capacitance located in a sub-pixel region of the plurality of sub-pixel regions and between the first electrode pad and the substrate;

the marks in the first region comprise a first mark, and the marks in the second region comprise a second mark;

along the second direction, in a same one sub-pixel region of the plurality of sub-pixel regions, the first mark is located on a first side of the storage capacitance; and along the second direction, in the same one sub-pixel, the second mark is located on a second side of the storage capacitance, and the first side and the second side are different sides of the storage capacitance.

5. The array substrate according to claim 3, further comprising a storage capacitance located in a sub-pixel region of the plurality of sub-pixel regions and between the first electrode pad and the substrate;

the marks in the first region comprise a first mark, and the marks in the second region comprise a second mark; the second mark comprises a first portion and a second portion that are arranged along the second direction; and in a direction perpendicular to a plane on which the substrate is located, the first portion overlaps the first connection via;

along the second direction, in a same one sub-pixel region of the plurality of sub-pixel regions, the first mark is located on a first side of the storage capacitance; and along the second direction, in the same one sub-pixel region, the first portion and the second portion are located on two sides of the storage capacitance respectively.

6. The array substrate according to claim 1, wherein the electrode pad comprises a first electrode pad and a second electrode pad, a plurality of first electrode pads are arranged along the first direction and the second direction, and a plurality of second electrode pads extend along the first direction and are arranged along the second direction;

a mark of the marks is electrically connected to the second electrode pad;

the array substrate further comprises a first metal layer and a second metal layer, the first metal layer is located between the substrate and the mark, the second metal layer is located between the first metal layer and the substrate, the first metal layer further comprises a second connection portion located in a sub-pixel legion of the plurality of sub-pixel regions, and the second metal layer comprises a first power line configured to supply a negative power voltage; and the mark is electrically connected to the second connection portion through a second connection via, and the second connection via is electrically connected to the first power line through a third connection via.

7. The array substrate according to claim 6, comprising a drive transistor and a first reset transistor, wherein the second metal layer further comprises a first reset signal connection line, and a first electrode of the first reset transistor is electrically connected to a gate of the drive transistor; the first reset signal connection line and the first power line extend along the second direction; and along the first direction, in a same one sub-pixel region of the plurality of sub-pixel regions, the first reset signal connection line is located on a side of the first power line and is connected to a second electrode of the first reset transistor;

the marks in the first region comprise a first mark, and the marks in the second region comprise a second mark; the second mark comprises a first portion and a second portion that are arranged along the first direction; and in a direction perpendicular to a plane on which the substrate is located, the first portion overlaps the second connection via;

along the first direction, in the same one sub-pixel region, the first mark and the first power line are located on a same side of the first reset signal connection line; and along the first direction, in the same one sub-pixel region, the first portion and the second portion are located on two sides of the first reset signal connection line respectively, wherein the second mark further comprises a third portion; and along the second direction, a minimum distance from the first portion to the first electrode pad is less than a minimum distance from the third portion to the first electrode pad.

8. The array substrate according to claim 6, further comprising a second reset transistor and an adjustment control signal line, wherein a first electrode of the second reset transistor is electrically connected to the first electrode pad, and the adjustment control signal line extends along the first direction, is electrically connected to a gate of the second reset transistor and is located between the second metal layer and the substrate; and along the second direction, in a same one sub-pixel region of the plurality of sub-pixel regions, the adjustment control signal line is located on a same side the first electrode pad and the second electrode pad;

the marks in the first region comprise a first mark, and the marks in the second region comprise a second mark; the second mark comprises a first portion and a second portion that are arranged along the second direction; and in a direction perpendicular to a plane on which the substrate is located, the first portion overlaps the second connection via;

along the second direction, in the same one sub-pixel region, the first mark is located between the second electrode pad and the adjustment control signal line; and along the second direction, in the same one sub-pixel region, the first portion and the second portion are located on two sides of the adjustment control signal line respectively, wherein the second mark further comprises a third portion, a fourth portion and a fifth portion;

along the second direction, the first portion is located between the second portion and the fifth portion; and along the first direction, the first portion is located between the third portion and the fourth portion.

9. The array substrate according to claim 6, wherein a plurality of first power lines extend along the second direction and are arranged along the first direction.

10. The array substrate according to claim 1, wherein the pixel disposition region comprises at least one pickup transfer region, a pickup transfer region of the at least one pickup transfer region comprises at least part of the first region and at least two second regions, and two second regions in a same one pickup transfer region of the at least one pickup transfer region are a first sub-region and a second sub-region; and the pickup transfer region is rectangular, and the first sub-region and the second sub-region are located at diagonal positions of the pickup transfer region respectively.

11. The array substrate according to claim 10, wherein the second arrangement pattern in the first sub-region is different from the second arrangement pattern in the second sub-region.

12. The array substrate according to claim 10, wherein a plurality of second regions further comprise a third sub-region; and in the same one pickup transfer region, the first sub-region, the second sub-region and the third sub-region are arranged along a third direction, the third sub-region is located between the first sub-region and the second sub-region, and the third direction is different from the first direction and the second direction.

13. The array substrate according to claim 1, wherein in the first region, the first arrangement patterns of at least two pixel regions of the plurality of pixel regions are the same.

14. The array substrate according to claim 1, wherein the first arrangement pattern and the second arrangement pattern occupy a same number of pixel regions of the plurality of pixel regions, wherein a pixel region of the plurality of pixel regions comprises a plurality of sub-pixel regions, the marks are located in the plurality of sub-pixel regions, and a sub-pixel region of the plurality of sub-pixel regions of the pixel region comprises a first sub-pixel region;

the same number of pixel regions occupied by the first arrangement pattern comprise a first pixel region, the same number of pixel regions occupied by the second arrangement pattern comprise a second pixel region, and the first pixel region and the second pixel region are arranged adjacent to each other along the second direction;

along the second direction, a minimum distance from a mark of the marks in a first sub-pixel region of the first pixel region to a mark of the marks in a first sub-pixel region of the second pixel region is S5;

the at least one pixel region in the first region further comprises a third pixel region, the third pixel region and the first pixel region are arranged adjacent to each other along the second direction; and the first pixel region is located between the second pixel region and the third pixel region; and along the second direction, a minimum distance from the mark in the first sub-pixel region of the first pixel region to a mark of the marks in a first sub-pixel region of the third pixel region is S6; and S5 ≠S6.

15. The array substrate according to claim 14, wherein the plurality of sub-pixel regions of a same pixel region of the plurality of pixel regions further comprises a second sub-pixel region and a third sub-pixel region, and the first sub-pixel region, the second sub-pixel region and the third sub-pixel region are arranged along the first direction and satisfy at least one of;

along the second direction, a minimum distance from a mark of the marks in a second sub-pixel region of the first pixel region to a mark of the marks in a second sub-pixel region of the second pixel region is S7; S5=S7; or along the second direction, a minimum distance from a mark of the marks in a third sub-pixel region of the first pixel region to a mark of the marks in a third sub-pixel region of the second pixel region is S8;

and S5=S8.

16. A display panel, comprising the array of substrate of claim 1, and a plurality of light-emitting diodes disposed in the plurality of pixel regions on the array substrate.

17. A display device, comprising the display panel of claim 16.

18. An array substrate, comprising:

a pixel disposition region, wherein the pixel disposition region comprises a plurality of pixel regions arranged along a first direction and a second direction, the first direction intersects the second direction;

and the pixel disposition region comprises a first region and a second region, and each of the first region and the second region comprise at least one pixel region of the plurality of pixel regions;

a substrate; and marks located on a side of the substrate and in the pixel disposition region, wherein a mark of the marks in the at least one pixel region in the first region has a first arrangement pattern, a mark of the marks in the at least one pixel region in the second region has a second arrangement pattern, and the first arrangement pattern is different from the second arrangement pattern, wherein a pixel region of the plurality of pixel regions comprises a plurality of sub-pixel regions;

the array substrate further comprises electrode pads located on a side of the substrate, an electrode pad of the electrode pads is at least partially located in a sub-pixel region of the plurality of sub-pixel regions and configured to be electrically connected to an electrode of a to-be-mounted light-emitting diode; and wherein the mark is located between a respective electrode pad of the electrode pads and the substrate.

19. The array substrate according to claim 18, wherein the electrode pad comprises a first electrode pad and a second electrode pad, a plurality of first electrode pads are arranged along the first direction and the second direction, and a plurality of second electrode pads extend along the first direction and are arranged along the second direction;

the array substrate further comprises a first metal layer, a second metal layer and a third connection portion, the mark is located in the first metal layer, the second metal layer is located between the first metal layer and the substrate and comprises a first power line configured to supply a negative power voltage; and the third connection portion is located in the plurality of sub-pixel regions and is electrically connected to the second electrode pad in a same layer; and the mark is electrically connected to the third connection portion through a second connection via, and the mark is electrically connected to the first power line through a third connection via.

20. An array substrate, comprising:

a pixel disposition region, wherein the pixel disposition region comprises a plurality of pixel regions arranged along a first direction and a second direction, the first direction intersects the second direction;

and the pixel disposition region comprises a first region and a second region, and each of the first region and the second region comprise at least one pixel region of the plurality of pixel regions;

a substrate; and marks located on a side of the substrate and in the pixel disposition region, wherein a mark of the marks in the at least one pixel region in the first region has a first arrangement pattern, a mark of the marks in the at least one pixel region in the second region has a second arrangement pattern, and the first arrangement pattern is different from the second arrangement pattern, wherein a pixel region of the plurality of pixel regions comprises a plurality of sub-pixel regions;

the array substrate further comprises electrode pads located on a side of the substrate, an electrode pad of the electrode pads is at least partially located in a sub-pixel region of the plurality of sub-pixel regions and configured to be electrically connected to an electrode of a to-be-mounted light-emitting diode; and the electrode pad comprises an overlapping region being a light-emitting diode disposition region, and an orthographic projection of a mark of the marks on the substrate do not overlap an orthographic projection of a respective overlapping region on the substrate;

wherein the marks in the first region comprise a first mark, and the marks in the second region comprise a second mark; the first mark and the second mark satisfy at least one of:

the electrode pad comprises a first electrode pad, and a plurality of first electrode pads are arranged along the first direction and the second direction;

a minimum distance from the first mark to a same one overlapping region of the first electrode pad in a same one sub-pixel region of the plurality of sub-pixel regions is SI along the first direction and is S2 along the second direction; a minimum distance from the second mark to the same one overlapping region of the first electrode pad in the same one sub-pixel region is S3 along the first direction and is S4 along the second direction; and S1, S2, S3, and S4 satisfy at least one of: S1≠S3 or S2≠S4; or, an orthographic projection area of the first mark on the substrate is less than an orthographic projection area of the second mark on the substrate.

* * * * *